(12) United States Patent
Bae et al.

(10) Patent No.: US 11,429,219 B2
(45) Date of Patent: Aug. 30, 2022

(54) LIGHT EMITTING DISPLAY DEVICE WITH INTEGRATED TOUCH SCREEN

(71) Applicant: LG Display Co., Ltd., Seoul (KR)

(72) Inventors: YeonGyeong Bae, Goyang-si (KR); Jonghyun Han, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/362,202

(22) Filed: Jun. 29, 2021

(65) Prior Publication Data

US 2021/0405797 A1    Dec. 30, 2021

(30) Foreign Application Priority Data

Jun. 30, 2020 (KR) .................. 10-2020-0080468

(51) Int. Cl.
*G06F 3/041* (2006.01)
*H01L 27/32* (2006.01)
*H01L 51/52* (2006.01)
*G06F 3/044* (2006.01)

(52) U.S. Cl.
CPC .......... *G06F 3/0412* (2013.01); *G06F 3/0445* (2019.05); *H01L 27/323* (2013.01); *H01L 27/326* (2013.01); *H01L 27/3246* (2013.01); *H01L 51/5253* (2013.01); *H01L 51/5259* (2013.01)

(58) Field of Classification Search
CPC ... G06F 3/0412; G06F 3/0445; H01L 27/323; H01L 27/3246; H01L 27/326; H01L 51/5253; H01L 51/5259
See application file for complete search history.

(56) References Cited

U.S. PATENT DOCUMENTS

2016/0093827 A1* 3/2016 Han .................. H01L 27/3244
257/40
2019/0393272 A1* 12/2019 Kajimoto ............ H01L 27/3209

* cited by examiner

*Primary Examiner* — Robert J Michaud
(74) *Attorney, Agent, or Firm* — Fenwick & West LLP

(57) ABSTRACT

A light emitting display device with an integrated touch screen includes: a substrate which includes a display area in which a plurality of display pixels is disposed and a non-display area around the display area; a light emitting diode in the display area; an encapsulation unit which covers the display area and the non-display area; a touch electrode line on the encapsulation unit; a touch routing line which is disposed in the non-display area and is connected to the touch electrode line; a plurality of blocking structures which is disposed in the non-display area and is configured to enclose the display area; and a step compensation layer disposed between the encapsulation unit and the touch routing line; wherein the step compensation layer reduces a step caused by the plurality of blocking structures to reduce irregularities of a surface of the encapsulation unit.

21 Claims, 17 Drawing Sheets

LIGHT EMITTING DISPLAY DEVICE WITH INTEGRATED TOUCH SCREEN

CROSS-REFERENCE TO RELATED APPLICATION

This application claims the priority of Republic of Korea Patent Application No. 10-2020-0080468 filed on Jun. 30, 2020, in the Korean Intellectual Property Office, the disclosure of which is hereby incorporated by reference in its entirety.

BACKGROUND

Field

The present disclosure relates to a light emitting display device with an integrated touch screen.

Description of the Related Art

As the information society develops, demands for display devices which display images are increasing and various types of display devices such as a liquid crystal display device or an organic light emitting display device are utilized.

In order to provide various functions to users, the display device recognizes a touch of a user on a display panel and performs input processing based on the recognized touch. For example, a plurality of touch electrodes is disposed in an active area of the display panel. The display device senses the touch by sensing a change in a capacitance of the touch electrode generated by the touch of the user. Specifically, when the display device is applied to an organic light emitting display device, elements which configure the touch element may be formed above or below an encapsulation film for protecting a light emitting unit of the organic light emitting display device. That is, in order to sense the touch of the user on the display panel, a plurality of touch electrodes are disposed in the display panel and a touch connection line which connects the touch electrodes and a driving circuit is disposed.

An active area of the display panel in which the touch electrodes are disposed may have various shapes and, in some cases, an area where a module such as a camera sensor or a proximity sensor is disposed may be located in the active area. Further, the area where the sensor is disposed may be disposed in the form of a hole in the active area.

However, there is a problem that it is difficult to dispose the touch electrode on the display panel depending on a type or a structural characteristic of the touch display device. There is another problem in that a failure that the touch connection line is shorted or disconnected may occur due to a basic structure of the display panel.

SUMMARY

When a touch electrode and a touch line are formed on an encapsulation unit which configures a panel of the display device, rather than separately manufacturing a touch panel to be attached to a display panel, touch lines are shorted due to a step caused by a blocking structure in a non-display area, which causes a failure of a touch operation.

Therefore, an object of the present disclosure is to provide a light emitting display device with an integrated touch screen which relieves a high step caused by a blocking structure.

Objects of the present disclosure are not limited to the above-mentioned objects, and other objects, which are not mentioned above, can be clearly understood by those skilled in the art from the following descriptions.

In order to achieve the above-described object, according to an aspect of the present disclosure, a light emitting display device with an integrated touch screen includes a substrate which includes a display area in which a plurality of pixels are disposed and a non-display area around the display area. An opening area which is located inside the display area and passes through the substrate and a function layer there above and a boundary area which is disposed to be in contact with the outside of the opening area may be included. There is a pixel area in the display area excluding the opening area and the boundary area. An encapsulation layer or encapsulation unit which covers the pixel area, the non-display area, and the boundary area may be included. A plurality of first touch electrodes which are disposed on the encapsulation layer or encapsulation unit of the pixel area and extends in a first direction and a plurality of second touch electrodes which extends in a second direction may be included. There are first and second blocking structures which are disposed in the non-display area and are configured to enclose the display area. A first touch routing line which is disposed on the first and second blocking structures and is connected to the first touch electrode may be included. A second touch routing line which is disposed on the first and second blocking structures and is connected to the second touch electrode may be included. An organic cover layer which covers the first touch routing line and the second touch routing line and a touch buffer layer which covers the encapsulation layer or encapsulation unit may be included. A step compensation layer which is located between the touch buffer layer and the first touch routing line and the second touch routing line may be included and the step compensation layer may be disposed to overlap the first and second blocking structures.

Further, according to another aspect of the present disclosure, a light emitting display device with an integrated touch screen includes a substrate which includes a display area in which a plurality of pixels are disposed and a non-display area around the display area. A light emitting diode may be disposed in the display area. An encapsulation unit which covers the display area and the non-display area is disposed and a touch sensor layer or touch electrode line may be located on the encapsulation unit. A touch routing line which is connected to the touch sensor layer or touch electrode line may be formed in the non-display area. An organic cover layer which is formed above the touch sensor layer or touch electrode line and the touch routing line and covers the touch sensor layer or touch electrode line and the touch routing line may be included. A plurality of blocking structures are disposed in the non-display area and are configured to enclose the display area and a step compensation layer between the encapsulation unit and the touch routing line may be included. The step compensation layer reduces the step caused by the plurality of blocking structures to reduce the irregularities of the surface of the encapsulation unit.

Other detailed matters of the exemplary embodiments are included in the detailed description and the drawings.

According to exemplary embodiments of the present disclosure, a step compensation layer which relieves a high step caused by a blocking structure is disposed above the blocking structure which overlaps touch routing lines of a display panel, thereby suppressing disconnection of the touch routing lines which pass through the blocking structure.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

Figure (FIG. 1 is a view illustrating a schematic configuration of a light emitting display device with an integrated touch screen according to exemplary embodiments of the present disclosure.

DETAILED DESCRIPTION

Figure 1:
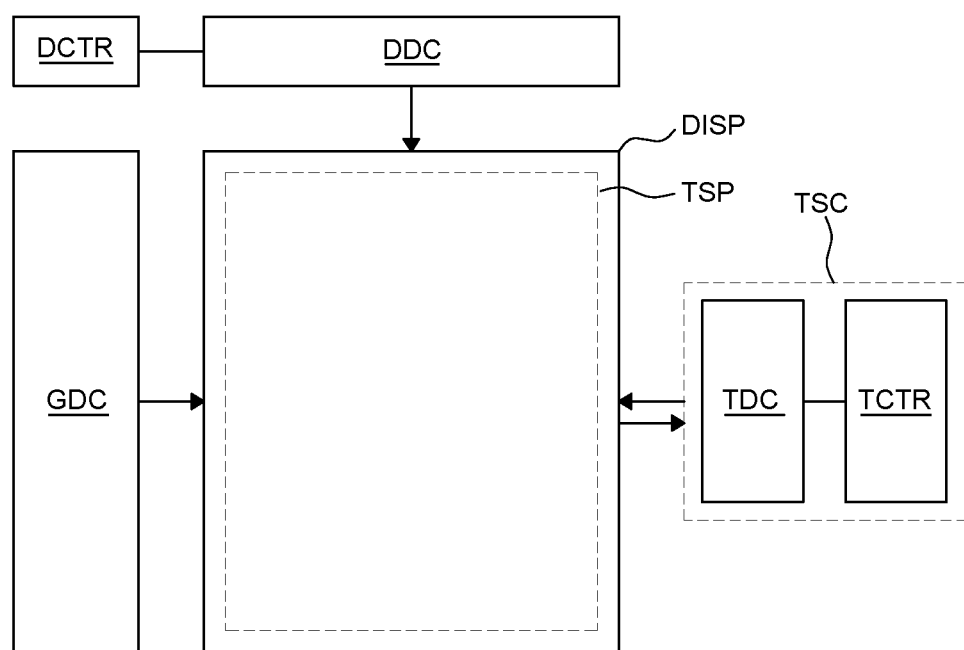

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, it may be directly disposed on the another layer or another element, or another layer or another element may be interposed therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Same reference numerals generally denote same elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, embodiments of the present disclosure will be described in detail with reference to the accompanying drawings.

FIG. 1 is a view of a system configuration of a light emitting display device with an integrated touch screen according to exemplary embodiments of the present disclosure.

Referring to FIG. 1, a light emitting display device with an integrated touch screen according to exemplary embodiments of the present disclosure may provide both a function for displaying images and a function for sensing touches.

In order to provide an image displaying function, the light emitting display device with an integrated touch screen according to exemplary embodiments of the present disclosure may include a display panel DISP, a data driving circuit DDC, a gate driving circuit GDC, and a display controller DCTR. In the display panel DISP, a plurality of data lines and a plurality of gate lines are disposed, and a plurality of pixels or sub-pixels defined by the plurality of data lines and the plurality of gate lines are disposed. The data driving circuit DDC drives the plurality of data lines and the gate driving circuit GDC drives the plurality of gate lines. The display controller DCTR controls operations of the data driving circuit DDC and the gate driving circuit GDC.

Each of the data driving circuit DDC, the gate driving circuit GDC, and the display controller DCTR may be implemented by one or more individual components. In some cases, two or more of the data driving circuit DDC, the gate driving circuit GDC, and the display controller DCTR may be implemented to be combined as one component. For example, the data driving circuit DDC and the display controller DCTR may be implemented as one integrated circuit (IC) chip.

In order to provide a touch sensing function, the light emitting display device with an integrated touch screen according to exemplary embodiments of the present disclosure may include a touch panel TSP and a touch sensing circuit TSC. The touch panel TSP includes a plurality of touch electrodes. The touch sensing circuit TSC supplies a touch driving signal to the touch panel TSP and detects a touch sensing signal from the touch panel TSP to sense the presence of a touch of a user or a touch position (touch coordinate) in the touch panel TSP based on the detected touch sensing signal.

For example, the touch sensing circuit TSC may include a touch driving circuit TDC and a touch controller TCTR. The touch driving circuit TDC supplies a touch driving signal to the touch panel TSP and detects a touch sensing signal from the touch panel TSP. The touch controller TCTR senses the presence of a touch of a user and/or a touch position in the touch panel TSP based on the touch sensing signal detected by the touch driving circuit TDC.

The touch driving circuit TDC may include a first circuit part which supplies the touch driving signal to the touch panel TSP and a second circuit part which detects the touch sensing signal from the touch panel TSP.

The touch driving circuit TDC and the touch controller TCTR may be implemented by separate components or in some cases, may be implemented to be combined as one component.

In the meantime, each of the data driving circuit DDC, the gate driving circuit GDC, and the touch driving circuit TDC may be implemented by one or more integrated circuits. From the viewpoint of electrical connection with the display panel DISP, the circuits may be implemented by a chip on glass (COG) type, a chip on film (COF) type, or a tape carrier package (TCP) type. Further, the gate driving circuit GDC may also be implemented by a gate in panel (GIP) type.

In the meantime, each of circuit configurations DDC, GDC, and DCTR for display driving and circuit configurations TDC and TCTR for touch sensing may be implemented by one or more individual components. In some cases, one or more of circuit configurations DDC, GDC, and DCTR for display driving and one or more of circuit configurations TDC and TCTR for touch sensing are functionally combined to be implemented by one or more components.

For example, the data driving circuit DDC and the touch driving circuit TDC may be implemented to be combined in one or two or more integrated circuit chips. When the data driving circuit DDC and the touch driving circuit TDC are implemented to be combined in two or more integrated circuit chips, each of two or more integrated circuit chips may have a data driving function and a touch driving function.

In the meantime, the light emitting display device with an integrated touch screen according to exemplary embodiments of the present disclosure may be various types such as an organic light emitting display device or a liquid crystal display device. In the following description, for the convenience of description, it will be described that the light emitting display device with an integrated touch screen is an organic light emitting display device as an example. That is, even though the display panel DISP may be various types such as an organic light emitting display panel or a liquid crystal display panel, in the following description, for the convenience of description, it will be described that the display panel is an organic light emitting display panel as an example.

Further, as it will be described below, the touch panel TSP may include a plurality of touch electrodes which are applied with a touch driving signal or detects a touch sensing signal therefrom, a plurality of touch routing lines which connects the plurality of touch electrodes to the touch driving circuit TDC, and the like.

The touch panel TSP may be provided at the outside of the display panel DISP. That is, the touch panel TSP and the display panel DISP may be separately manufactured to be combined. Such a touch panel TSP is called an external type or an add-on type.

In contrast, the touch panel TSP may be embedded in the display panel DISP. That is, when the display panel DISP is manufactured, a touch sensor structure such as a plurality of touch electrodes and a plurality of touch routing lines which configure a touch panel TSP may be formed together with electrodes and signal lines for display driving. Such a touch panel TSP is called an embedded type. In the following description, for the convenience of description, it will be described that the touch panel TSP is an embedded type as an example.

Figure 2:
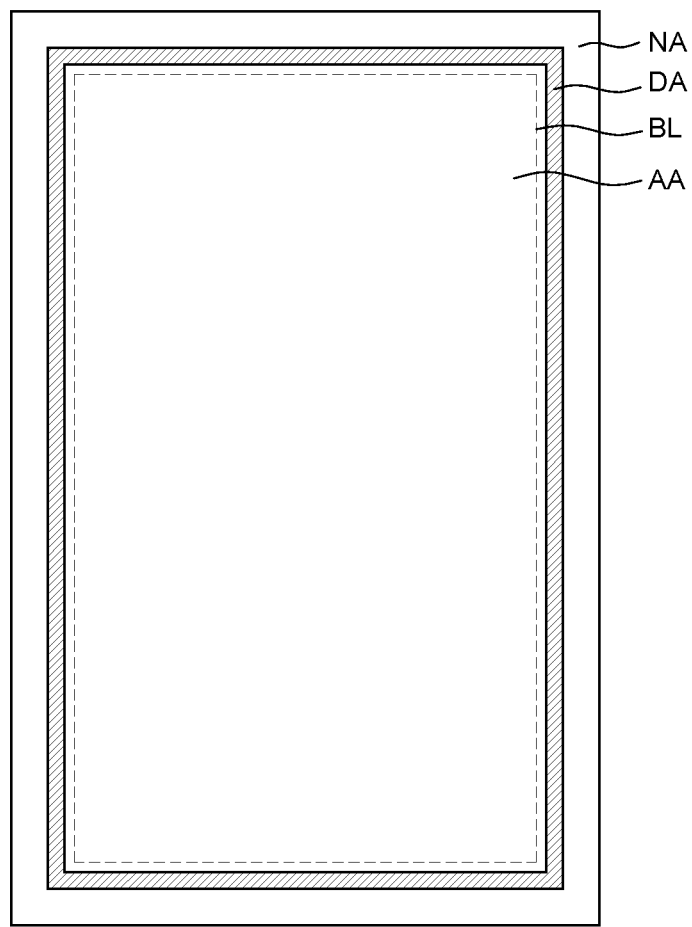
FIG. 2 is a view schematically illustrating a display panel of a light emitting display device with an integrated touch screen according to exemplary embodiments of the present disclosure.

FIG. 2 is a view schematically illustrating a display panel DISP of a light emitting display device with an integrated touch screen according to exemplary embodiments of the present disclosure.

Referring to FIG. 2, the display panel DISP may include an active area AA in which images are displayed and a non-active area NA which is an outer area of an outer boundary line BL of the active area AA.

In the active area AA of the display panel DISP, a plurality of sub-pixels for displaying images are disposed and various electrodes or signal lines for driving the display are disposed.

Further, in the active area AA of the display panel DISP, a plurality of touch electrodes for touch sensing, a plurality of touch routing lines electrically connected thereto, and the like may be disposed. Accordingly, the active area AA may also be referred to as a touch sensing area which is capable of sensing the touch.

In the non-active area NA of the display panel DISP, link lines extending from various signal lines disposed in the active area AA or link lines which are electrically connected to various signal lines disposed in the active area AA, and pads which are electrically connected to the link lines may be disposed. The pads disposed in the non-active area NA may be bonded or electrically connected with display driving circuits DDC, GDC, or the like.

Further, in the non-active area NA of the display panel DISP, link lines extending from a plurality of touch routing lines disposed in the active area AA or link lines which are electrically connected to a plurality of touch routing lines disposed in the active area AA, and pads which are electrically connected to the link lines may be disposed. The pads disposed in the non-active area NA may be bonded or electrically connected with the touch driving circuit TDC.

In the non-active area NA, a part of an outermost touch electrode among a plurality of touch electrodes disposed in the active area AA may expand or one or more electrodes (touch electrodes) formed of the same material as the plurality of touch electrodes disposed in the active area AA may be further disposed.

That is, all the plurality of touch electrodes disposed in the display panel DISP may be disposed in the active area AA or some (for example, an outermost touch electrode) among the plurality of touch electrodes disposed in the display panel DISP may be disposed in the non-active area NA. Some (for example, an outermost touch electrode) among the plurality of touch electrodes disposed in the display panel DISP may be disposed in both the active area AA and the non-display area NA.

In the meantime, referring to FIG. 2, the display panel DISP of the light emitting display device with an integrated touch screen according to the exemplary embodiments of the present disclosure may include a dam area DA. In the dam area, a dam DAM (see FIG. 9) is disposed to suppress collapse of any layer (for example, an encapsulation unit ENCAP in the organic light emitting display panel) in the active area AA. That is, the dam DAM may function to suppress an organic layer included in the encapsulation unit ENCAP from outwardly overflowing. Therefore, the dam DAM may be referred to as a blocking structure.

The dam area DA may be located at a boundary of the active area AA and the non-active area NA or at any one position of a non-active area NA which is an outer area of the active area AA.

The dam disposed in the dam area DA may be disposed to enclose all directions of the active area AA or disposed only at an outside of one or two or more parts (a part having a layer which may easily collapse) of the active area AA.

The dam disposed in the dam area DA may have one pattern in which all the dams are connected or two or more separated patterns. Further, in the dam area DA, only a primary dam may be disposed or two or more dams (primary dam and secondary dam) may be disposed, or three or more dams may be disposed.

In the dam area DA, in any one direction, only the primary dam is disposed and in the other direction, both the primary dam and the secondary dam may be disposed.

Figure 3:
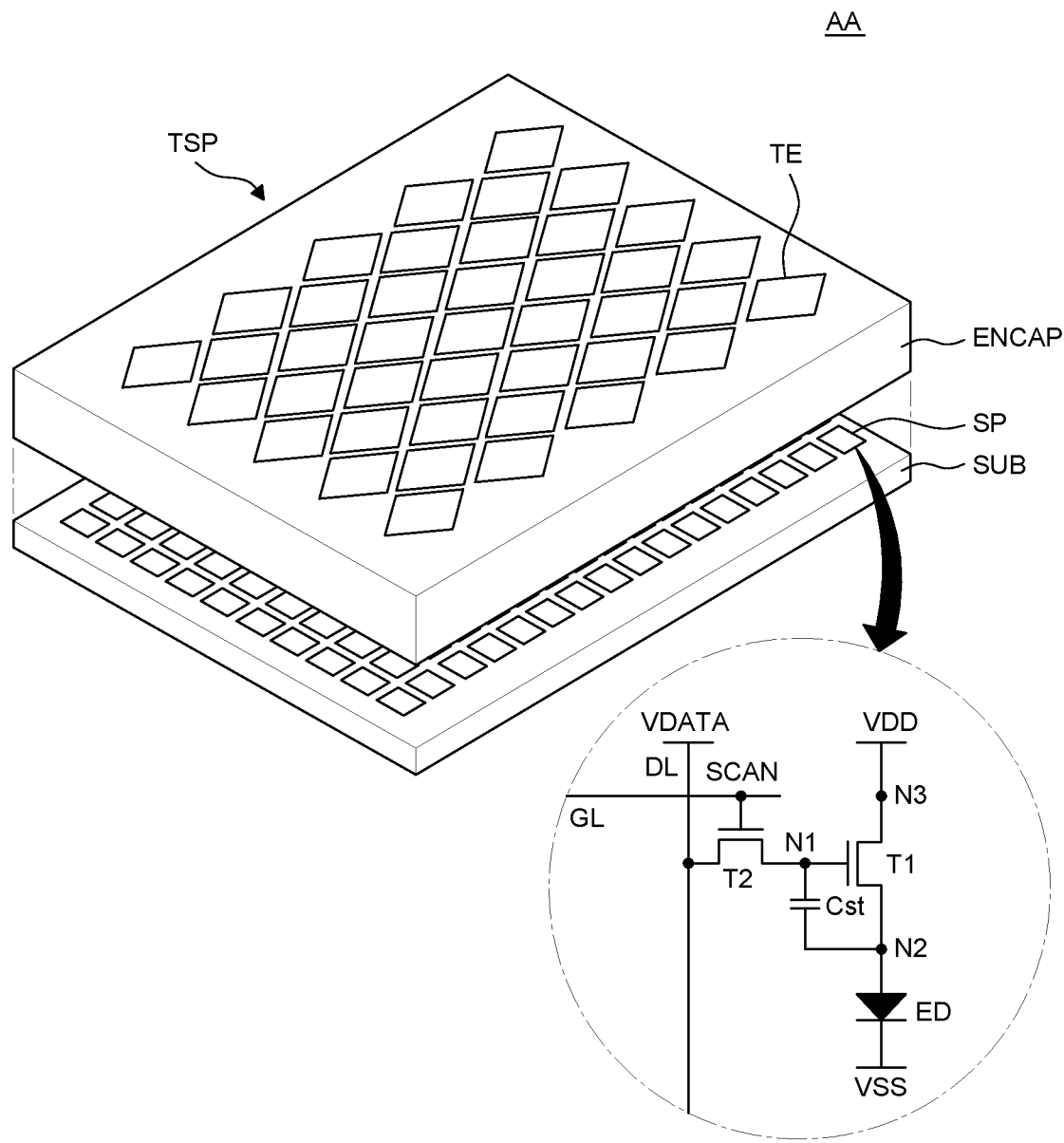
FIG. 3 is an exemplary view illustrating a structure in which a touch panel is embedded in a display panel according to exemplary embodiments of the present disclosure.

FIG. 3 is an exemplary view illustrating a structure in which a touch panel TSP is embedded in a display panel DISP according to exemplary embodiments of the present disclosure.

Referring to FIG. 3, in the active area AA of the display panel DISP, a plurality of sub-pixels SP are disposed on a substrate SUB.

Each sub-pixel SP may include a light emitting diode ED, a first transistor T1 for driving the light emitting diode ED, a second transistor T2 for transmitting a data voltage VDATA to a first node N1 of the first transistor T1, and a storage capacitor Cst for maintaining a constant voltage for one frame.

The first transistor T1 may include a first node N1 to which the data voltage VDATA is applied, a second node N2 which is electrically connected to the light emitting diode ED, and a third node N3 to which a driving voltage VDD is applied from a driving voltage line DVL. The first node N1 is a gate node, the second node N2 is a source node or a drain node, and the third node N3 is a drain node or a source node. The first transistor T1 may also be referred to as a driving transistor which drives the light emitting diode ED.

The light emitting diode ED may include a first electrode (for example, an anode electrode), an emission layer, and a second electrode (for example, a cathode electrode). The first electrode is electrically connected to the second node N2 of the first transistor T1 and the second electrode may be applied with a base voltage VSS.

The emission layer in such a light emitting diode ED may be an organic emission layer including an organic material. In this case, the light emitting diode ED may be an organic light emitting diode OLED.

The second transistor T2 is controlled to be turned on or off by a scan signal SCAN applied through the gate line GL and is electrically connected between the first node N1 of the first transistor T1 and the data line DL. Such a second transistor T2 is also referred to as a switching transistor.

When the second transistor T2 is turned on by the scan signal SCAN, the second transistor T2 transmits the data voltage VDATA supplied from the data line DL to the first node N1 of the first transistor T1.

The storage capacitor Cst may be electrically connected between the first node N1 and the second node N2 of the first transistor T1.

As illustrated in FIG. 3, each sub-pixel SP may have a 2T1C structure including two transistors T1 and T2 and one capacitor Cst and in some cases, may further include one or more transistors or further include one or more capacitors.

The storage capacitor Cst may be an external capacitor which is intentionally designed at the outside of the first transistor T1, rather than a parasitic capacitor (for example, Cgs or Cgd) which is an internal capacitor formed between the first node N1 and the second node N2 of the first transistor T1.

Each of the first transistor T1 and the second transistor T2 may be an n-type transistor or a p-type transistor.

In the meantime, as described above, in the display panel DISP, circuit elements such as a light emitting diode ED, two or more transistor T1 and T2, and one or more capacitor Cst are disposed. The circuit element (specifically, a light emitting diode ED) is vulnerable to moisture or oxygen from the outside. Therefore, an encapsulation unit ENCAP may be disposed in the display panel DISP to suppress the permeation of the moisture or oxygen from the outside into the circuit element (specifically, the light emitting diode ED).

The encapsulation unit ENCAP may be formed by one layer or a plurality of layers.

In the meantime, in the light emitting display device with an integrated touch screen according to the exemplary embodiments of the present disclosure, the touch panel TSP may be formed on the encapsulation unit ENCAP.

That is, in the light emitting display device with an integrated touch screen, a touch sensor structure such as a plurality of touch electrodes TE which forms a touch panel TSP may be disposed on the encapsulation unit ENCAP.

During the touch sensing, a touch driving signal may be applied to the touch electrode TE, or a touch sensing signal may be detected from the touch electrode TE. Accordingly, during the touch sensing, a potential difference is formed between the touch electrode TE and the cathode electrode which are disposed with the encapsulation unit ENCAP therebetween so that unnecessary parasitic capacitance may be formed. Such a parasitic capacitance may degrade a touch sensitivity. Therefore, in order to lower the parasitic capacitance, a distance between the touch electrode TE and the cathode electrode may be designed to be a predetermined value (for example, 1 μm) or larger in consideration of a panel thickness, a panel manufacturing process, and a display performance. To this end, for example, the thickness of the encapsulation unit ENCAP may be designed to be at least 1 μm or larger.

Figure 4:
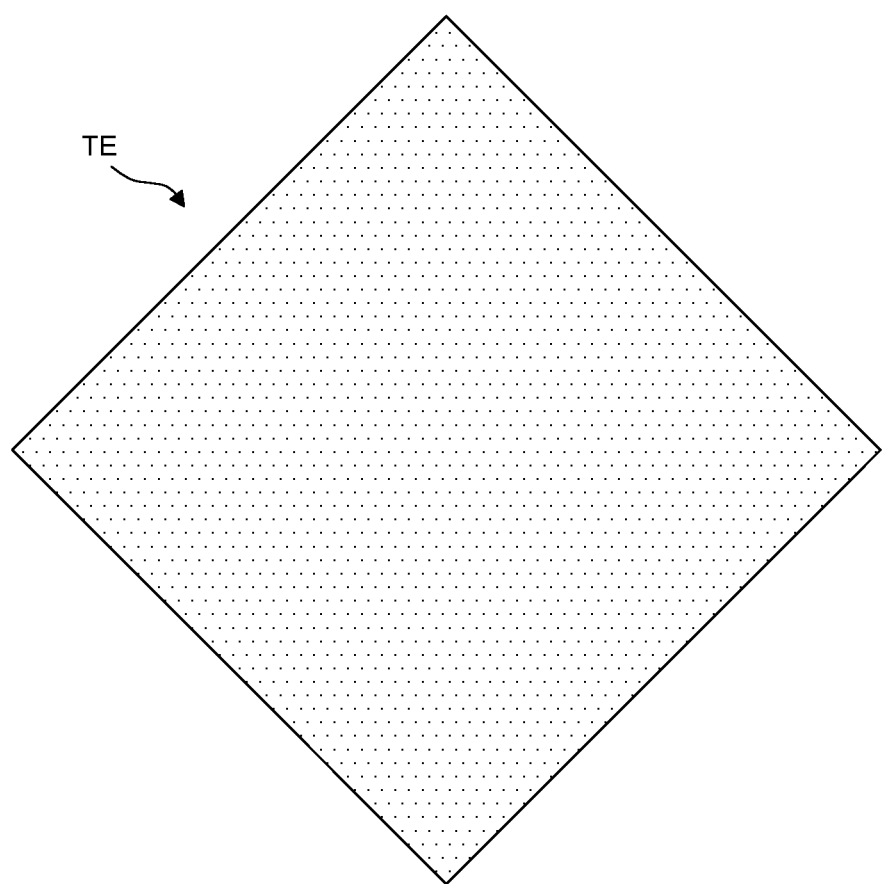
FIGS. 4 and 5 are exemplary views illustrating a type of a touch electrode disposed in a display panel according to exemplary embodiments of the present disclosure.
Figure 5:
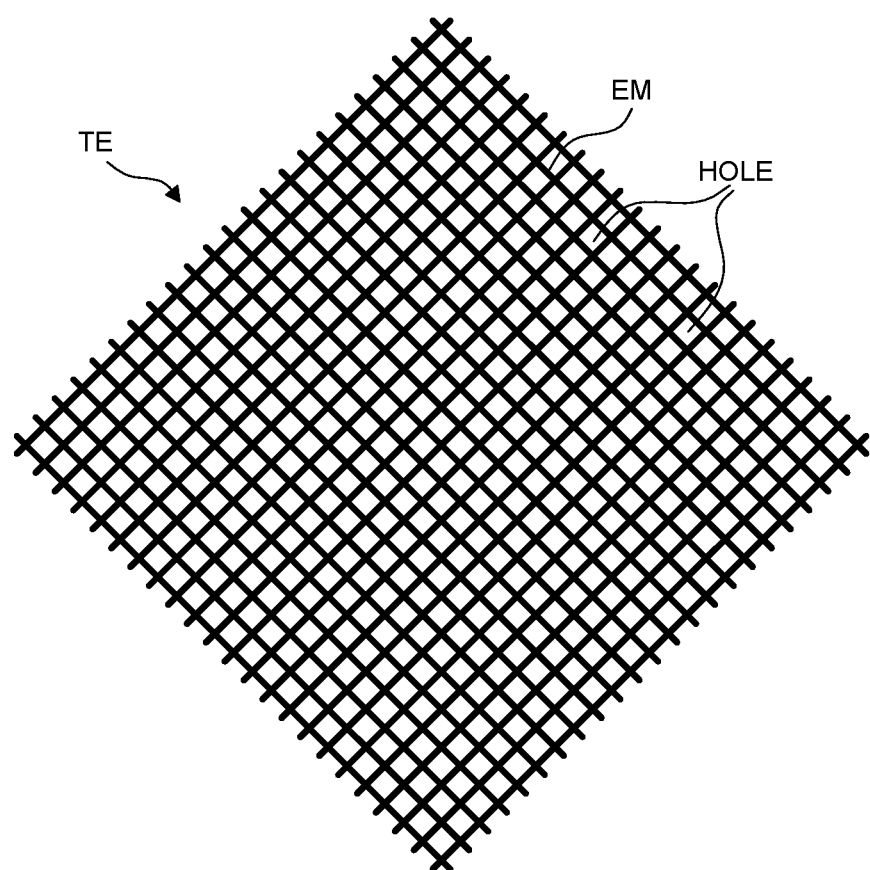

FIGS. 4 and 5 are exemplary views illustrating types of a touch electrode TE disposed in a display panel DISP according to exemplary embodiments of the present disclosure.

As illustrated in FIG. 4, each touch electrode TE disposed in the display panel DISP may be a plate type electrode metal which does not have holes. In this case, each touch electrode TE may be a transparent electrode. That is, each touch electrode TE may be formed of a transparent electrode material so that light emitted from a plurality of sub-pixels SP disposed there below is upwardly transmitted.

In contrast, as illustrated in FIG. 5, each touch electrode TE disposed in the display panel DISP may be an electrode metal EM which is patterned in a mesh type to have two or more holes.

The electrode metal EM is a portion which corresponds to a substantial touch electrode TE so that a touch driving signal is applied or a touch sensing signal is sensed thereby.

As illustrated in FIG. 5, when each touch electrode TE is an electrode metal EM patterned in a mesh type, there may be two or more holes in an area of the touch electrode TE.

Each of two or more holes in each touch electrode TE may correspond to an emission area of one or more sub-pixels SP. That is, a plurality of holes serves as a path through which light emitted from the plurality of sub-pixels SP disposed there below upwardly passes. In the following description, for the convenience of description, it will be described that each touch electrode TE is a mesh type electrode metal EM as an example.

The electrode metal EM corresponding to each touch electrode TE may be located on a bank which is disposed in an area other than the emission area of two or more sub-pixels SP.

In the meantime, in order to form a plurality of touch electrodes TE, the electrode metal ME is broadly formed to be a mesh type and then the electrode metal EM is cut to have a predetermined pattern to electrically separate the electrode metals EM. Consequently, a plurality of touch electrodes TE may be created.

An outline shape of the touch electrode TE may be a square shape such as a diamond shape or a rhombus, as illustrated in FIGS. 4 and 5 or may be various shapes such as a triangle, a pentagon, or a hexagon.

Figure 6:
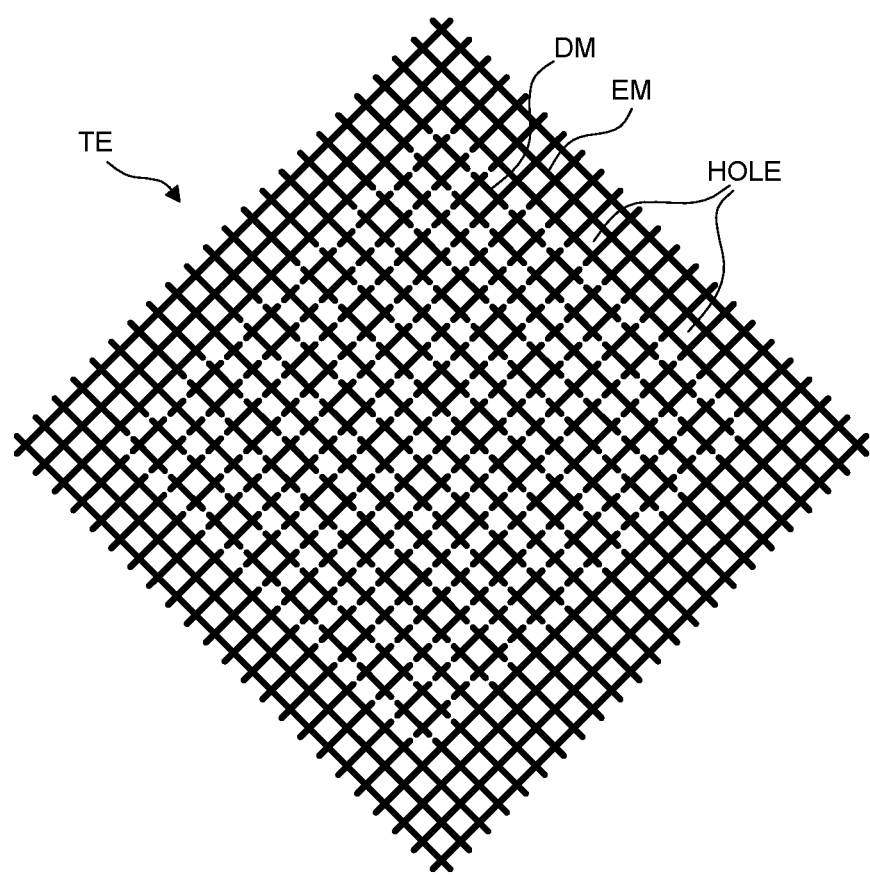
FIG. 6 is an exemplary view illustrating a mesh-type touch electrode of FIG. 5 according to one embodiment.

FIG. 6 is an exemplary view illustrating a mesh-type touch electrode TE of FIG. 5 according to one embodiment.

Referring to FIG. 6, in an area of each touch electrode TE, the mesh type electrode metal EM and one or more dummy metals DM which are disconnected may be provided.

The electrode metal EM corresponds to a substantial touch electrode TE so that a touch driving signal is applied or a touch sensing signal is sensed thereby. However, even though the dummy metal DM is provided in the area of the touch electrode TE, the touch driving signal is not applied and the touch sensing signal is not also sensed. That is, the dummy metal DM may be an electrically floating metal.

Accordingly, the electrode metal EM may be electrically connected to the touch driving circuit TDC, but the dummy metal DM is not electrically connected to the touch driving circuit TDC.

In the area of each touch electrode TE, one or more dummy metals DM may be provided to be disconnected from the electrode metal EM.

In contrast, only in the area of each of some touch electrodes TE among all touch electrodes TE, one or more dummy metals DM may be provided to be disconnected from the electrode metal EM. That is, in an area of some touch electrodes TE, the dummy metal DM may not be provided.

In the meantime, with regard to the role of the dummy metal DM, as illustrated in FIG. 5, when one or more dummy metals DM are not provided in the area of the touch electrode TE, but only the electrode metal EM is provided as a mesh type, there may be a visibility issue that an outline of the electrode metal EM is visible on a screen.

In contrast, as illustrated in FIG. 6, when one or more dummy metals DM are provided in the area of the touch electrode TE, the visibility issue that an outline of the electrode metal EM is visible on the screen may be suppressed.

Further, for each touch electrode TE, the presence or the number of dummy metals DM (a ratio of dummy metals) is adjusted so that a magnitude of capacitance is adjusted for each touch electrode TE, to improve a touch sensitivity.

In the meantime, some branches of the electrode metal EM formed in the area of one touch electrode TE are cut so that the cut electrode metal EM may be formed as a dummy metal DM. That is, the electrode metal EM and the dummy metal DM may be the same material formed on the same layer.

In the meantime, the light emitting display device with an integrated touch screen according to the exemplary embodiments of the present disclosure may sense the touch based on the capacitance formed in the touch electrode TE.

The light emitting display device with an integrated touch screen according to the exemplary embodiments of the present disclosure employs a capacitance-based touch sensing manner so that the touch is sensed by a mutual-capacitance-based touch sensing manner or a self-capacitance-based touch sensing manner.

According to the mutual-capacitance-based touch sensing manner, a plurality of touch electrodes TE may be classified into a driving touch electrode (a transmission touch electrode) to which a touch driving signal is applied and a sensing touch electrode (a reception touch electrode) which detects a touch sensing signal and forms a capacitance with the driving touch electrode.

In the case of the mutual-capacitance-based touch sensing manner, the touch sensing circuit TSC senses the presence of the touch and/or the touch coordinate based on the change in capacitance between the driving touch electrode and the sensing touch electrode (mutual-capacitance) depending on the presence of a pointer such as a finger or a pen.

According to the self-capacitance-based touch sensing manner, each touch electrode TE may serve as both a driving touch electrode and a sensing touch electrode. That is, the touch sensing circuit TSC applies a touch driving signal to one or more touch electrodes TE and detects a touch sensing signal by means of the touch electrode TE applied with the touch driving signal. The touch sensing circuit TSC identifies the change in capacitance between a pointer such as a finger or a pen and the touch electrode TE based on the detected touch sensing signal to sense the presence of touch and/or the touch coordinate. In the self-capacitance-based touch sensing manner, the driving touch electrode and the sensing touch electrode are not distinguished.

As described above, the light emitting display device with an integrated touch screen according to the exemplary embodiments of the present disclosure may sense the touch by a mutual-capacitance-based touch sensing manner or a self-capacitance-based touch sensing manner. However, in the following description, for the convenience of description, it will be described that the light emitting display device with an integrated touch screen performs mutual-capacitance-based touch sensing and includes a touch sensor structure therefor, as an example.

Figure 7:
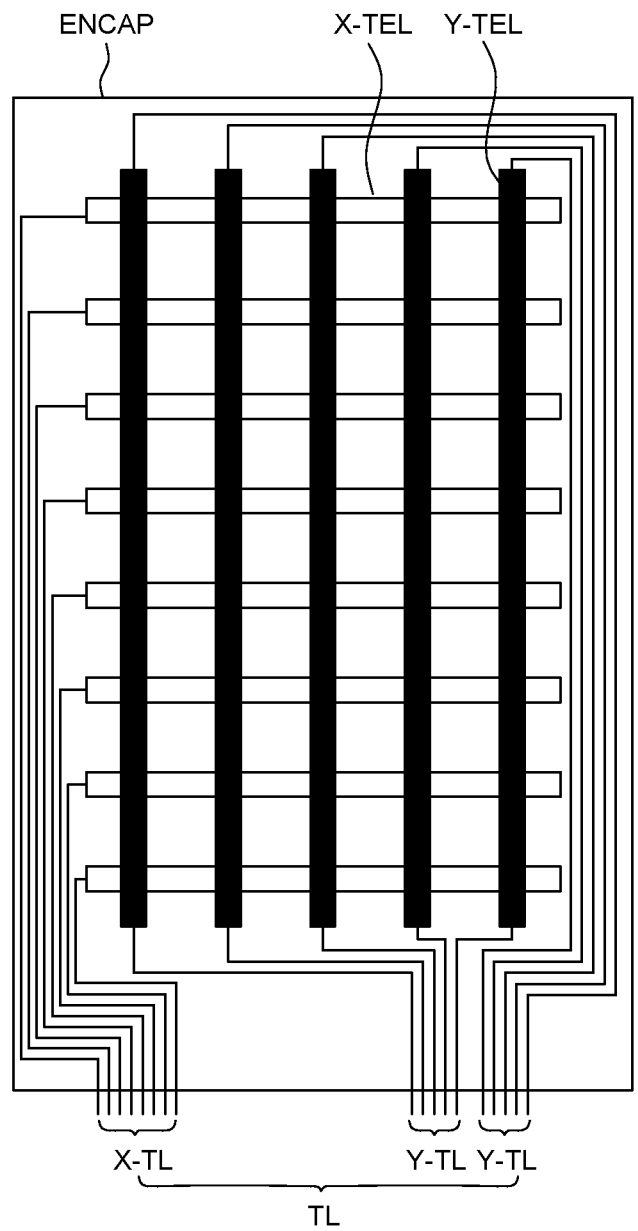
FIG. 7 is a view illustrating a touch sensor structure in a display panel according to exemplary embodiments of the present disclosure.
Figure 8:
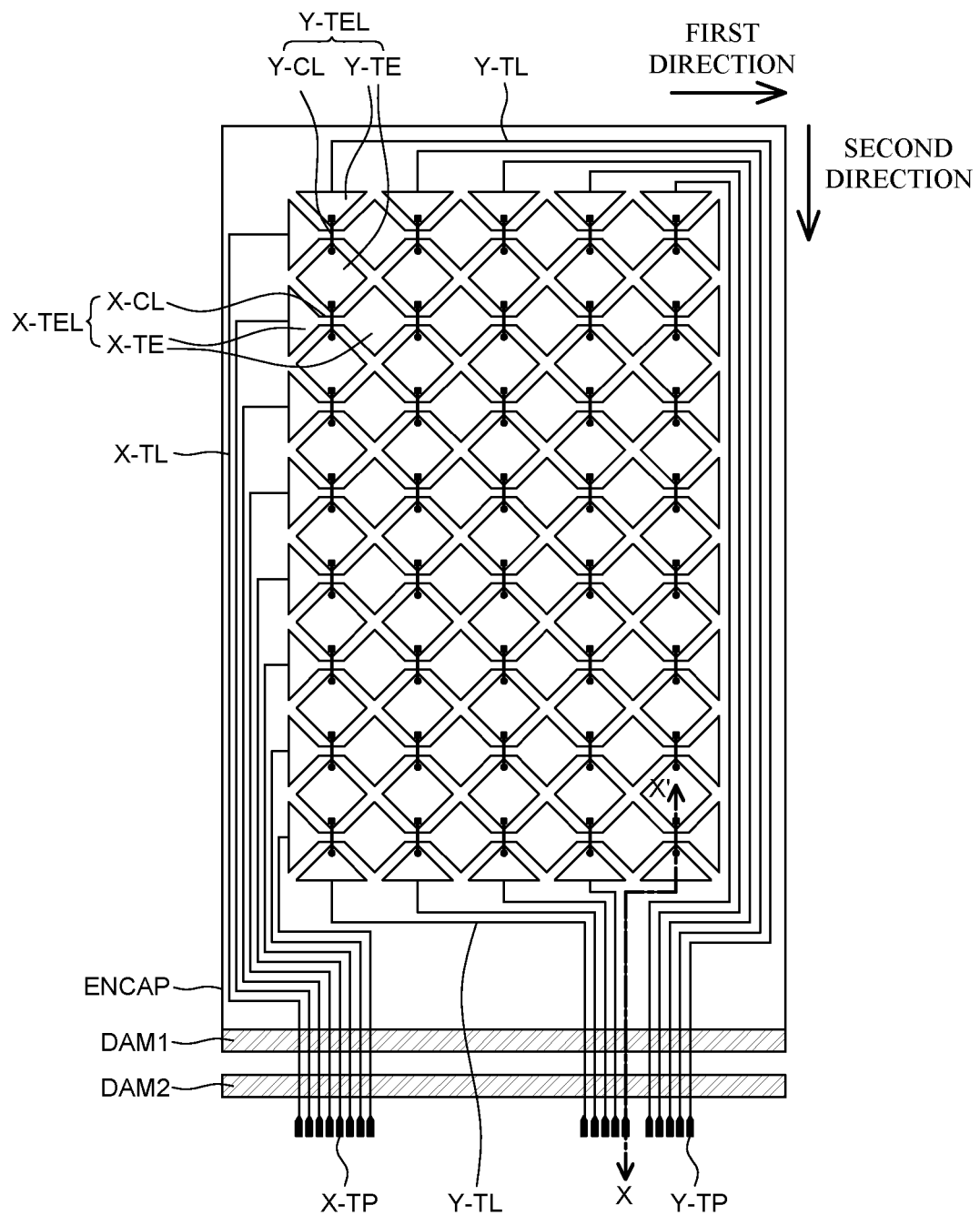
FIG. 8 is a view of an implementation example of a touch sensor structure of FIG. 7 according to one embodiment.

FIG. 7 is a view illustrating a touch sensor structure in a display panel DISP according to exemplary embodiments of the present disclosure and FIG. 8 is a view of an implementation example of a touch sensor structure of FIG. 7 according to one embodiment.

Referring to FIG. 7, a touch sensor structure for mutual-capacitance-based touch sensing may include a plurality of X-touch electrode lines X-TEL and a plurality of Y-touch electrode lines Y-TEL. Here, the plurality of X-touch electrode lines X-TEL and the plurality of Y-touch electrode lines Y-TEL are located on the encapsulation unit ENCAP. The X-touch electrode line is referred to as a first touch electrode line and the Y-touch electrode line is referred to as a second touch electrode line.

Each of the plurality of X-touch electrode lines X-TEL may be disposed in a first direction and each of the plurality of Y-touch electrode lines Y-TEL is disposed in a second direction which is different from the first direction.

In the present disclosure, the first direction and the second direction are relatively different directions and for example, the first direction may be an x-axis direction and the second direction may be a y-axis direction. In contrast, the first direction may be a y-axis direction and the second direction may be an x-axis direction. Further, the first direction and the second direction may be perpendicular to each other but may not be perpendicular. Further, in the present disclosure, a row and a column are relative so that the row and the column may be switched depending on the viewing point.

Each of the plurality of X-touch electrode lines X-TEL may be configured by a plurality of X-touch electrodes X-TE which is electrically connected. Each of the plurality of Y-touch electrode lines Y-TEL may be configured by a plurality of Y-touch electrodes Y-TE which are electrically connected. The X-touch electrode may be referred to as a first touch electrode and the Y-touch electrode may be referred to as a second touch electrode.

Here, the plurality of X-touch electrodes X-TE and the plurality of Y-touch electrodes Y-TE are included in the plurality of touch electrodes TE and have distinguished roles (functions).

For example, the plurality of X-touch electrodes X-TE which configures each of the plurality of X-touch electrode lines X-TEL may be driving touch electrodes and the plurality of Y-touch electrodes Y-TE which configures each of the plurality of Y-touch electrode lines Y-TEL may be sensing touch electrodes. In this case, each of the plurality of X-touch electrode lines X-TEL corresponds to the driving touch electrode line and each of the plurality of Y-touch electrode lines Y-TEL corresponds to the sensing touch electrode line.

In contrast, the plurality of X-touch electrodes X-TE which configures the plurality of X-touch electrode lines X-TEL may be sensing touch electrodes and the plurality of Y-touch electrodes Y-TE which configures the plurality of Y-touch electrode lines Y-TEL may be driving touch electrodes. In this case, each of the plurality of X-touch electrode lines X-TEL corresponds to the sensing touch electrode line and each of the plurality of Y-touch electrode lines Y-TEL corresponds to the driving touch electrode line.

The touch sensor metal for touch sensing may include a plurality of touch routing lines TL in addition to the plurality of X-touch electrode lines X-TEL and the plurality of Y-touch electrode lines Y-TEL.

The plurality of touch routing lines TL may include one or more X-touch routing lines X-TL connected to each of the plurality of X-touch electrode lines X-TEL and one or more Y-touch routing lines Y-TL connected to each of the plurality of Y-touch electrode lines Y-TEL.

Referring to FIG. 8, each of the plurality of X-touch electrode lines X-TEL may include a plurality of X-touch electrodes X-TE disposed in the same row (or column) and one or more X-touch electrode connection lines X-CL which electrically connect the plurality of X-touch electrodes. Here, the X-touch electrode connection line X-CL which connects two adjacent X-touch electrodes X-TE may be a metal integrated with two adjacent X-touch electrodes X-TE (an example in FIG. 8) or a metal connected to two adjacent X-touch electrodes X-TE through a contact hole.

Each of the plurality of Y-touch electrode lines Y-TEL may include a plurality of Y-touch electrodes Y-TE disposed in the same column (or row) and one or more Y-touch electrode connection lines Y-CL which electrically connect the plurality of Y-touch electrodes. Here, the Y-touch electrode connection line Y-CL which connects two adjacent Y-touch electrodes Y-TE may be a metal integrated with two adjacent Y-touch electrodes Y-TE or a metal connected to two adjacent Y-touch electrodes Y-TE through a contact hole (an example in FIG. 8).

In a region (a touch electrode line intersecting region) where the X-touch electrode line X-TEL and the Y-touch electrode line Y-TEL intersect, the X-touch electrode connection line X-CL and the Y-touch electrode connection line Y-CL may intersect.

In this case, in a region (a touch electrode line intersecting region) where the X-touch electrode line X-TEL and the Y-touch electrode line Y-TEL intersect, the X-touch electrode connection line X-CL and the Y-touch electrode connection line Y-CL may intersect.

As described above, when the X-touch electrode connection line X-CL and the Y-touch electrode connection line Y-CL intersect in the touch electrode line intersecting region, the X-touch electrode connection line X-CL and the Y-touch electrode connection line Y-CL need to be located on different layers.

Accordingly, in order to dispose the plurality of X-touch electrode lines X-TEL and the plurality of Y-touch electrode lines Y-TEL to intersect, the plurality of X-touch electrodes X-TE, the plurality of X-touch electrode connection lines X-CL, the plurality of Y-touch electrodes Y-TE, and the plurality of Y-touch electrode connection lines Y-CL may be located on two or more layers. The X-touch electrode connection line is referred to as a first touch electrode connection line and the Y-touch electrode connection line is referred to as a second touch electrode connection line.

Referring to FIG. 8, each of the plurality of X-touch electrode lines X-TEL is electrically connected to an X-touch pad X-TP by means of one or more X-touch routing lines X-TL. That is, an X-touch electrode X-TE which is disposed at the outermost side, among the plurality of X-touch electrodes X-TE included in one X-touch electrode line X-TEL, is electrically connected to a corresponding X-touch pad X-TP by means of the X-touch routing line X-TL.

Each of the plurality of Y-touch electrode lines Y-TEL is electrically connected to a Y-touch pad Y-TP by means of one or more Y-touch routing lines Y-TL. That is, a Y-touch electrode Y-TE which is disposed at the outermost side, among the plurality of Y-touch electrodes Y-TE included in one Y-touch electrode line Y-TEL, is electrically connected to a corresponding Y-touch pad Y-TP by means of the Y-touch routing line Y-TL.

In the meantime, as illustrated in FIG. 8, the plurality of X-touch electrode lines X-TEL and the plurality of Y-touch electrode lines Y-TEL may be disposed on the encapsulation unit ENCAP. That is, the plurality of X-touch electrodes X-TE and the plurality of X-touch electrode connection lines X-CL which configures the plurality of X-touch electrode lines X-TEL may be disposed on the encapsulation unit ENCAP. The plurality of Y-touch electrodes Y-TE and the plurality of Y-touch electrode connection lines Y-CL which configures the plurality of Y-touch electrode lines Y-TEL may be disposed on the encapsulation unit ENCAP.

In the meantime, as illustrated in FIG. 8, each of the plurality of X-touch routing lines X-TL which are electrically connected to the plurality of X-touch electrode lines X-TEL may extend to a portion where the encapsulation unit ENCAP is not provided while being disposed on the encapsulation unit ENCAP to be electrically connected to the plurality of X-touch pads X-TP. Each of the plurality of Y-touch routing lines Y-TL which are electrically connected to the plurality of Y-touch electrode lines Y-TEL may extend to a portion where the encapsulation unit ENCAP is not provided while being disposed on the encapsulation unit ENCAP to be electrically connected to the plurality of Y-touch pads Y-TP. Here, the encapsulation unit ENCAP may be located in the active area AA and in some cases, may extend to the non-active area NA.

In the meantime, as described above, in order to suppress the collapse of any layer (for example, the encapsulation unit ENCAP in the organic light emitting display panel) in the active area AA, there may be a dam area DA in a boundary area of the active area AA and the non-active area NA or a non-active area NA which is an outer area of the active area AA. That is, the dam DAM may function to suppress an organic layer included in the encapsulation unit ENCAP from outwardly overflowing. Therefore, the dam DAM may be referred to as a blocking structure.

As illustrated in FIG. 8, for example, in the dam area DA, a primary dam DAM1 and a secondary dam DAM2 may be disposed. Here, the secondary dam DAM2 may be located at an outside more than the primary dam DAM1.

In contrast to the example of FIG. 8, only the primary dam DAM1 is located in the dam area DA and in some cases, not only the primary dam DAM1 and the secondary dam DAM2, but also one or more additional dams may be further disposed in the dam area DA.

In the meantime, referring to FIG. 8, the encapsulation unit ENCAP may be located at the side surface of the primary dam DAM1 or the encapsulation unit ENCAP may be located not only on the side surface of the primary dam DAM1, but also above the primary dam DAM1.

Figure 9:
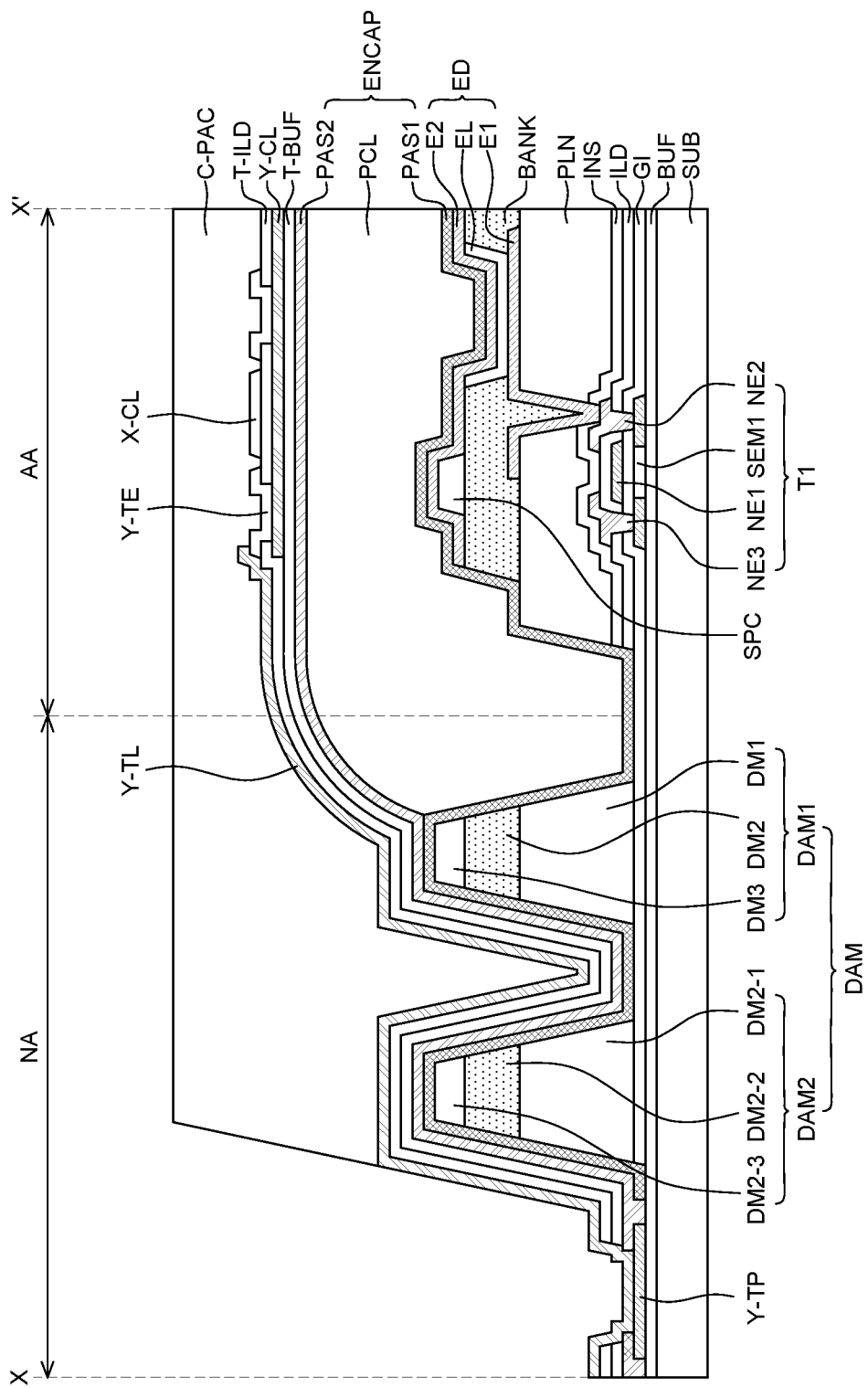
FIG. 9 is a partial cross-sectional view of a display panel which is an example of a cross-sectional structure taken along the line X-X' of FIG. 8 according to exemplary embodiments of the present disclosure.

FIG. 9 is a partial cross-sectional view of a display panel DISP taken along the line X-X' of FIG. 8 according to exemplary embodiments of the present disclosure. However, in FIG. 9, the touch electrode TE is illustrated as a plate shape, but this is merely an example, so that the touch electrode may be a mesh type. When the touch electrode TE is a mesh type, holes of the touch electrode TE may be located on an emission area of the sub-pixel SP.

A buffer layer BUF having a single-layered or a multi-layered structure may be disposed on a substrate SUB. The substrate SUB may be formed of a flexible material. When the substrate SUB is formed of a material such as polyimide, the buffer layer BUF may be formed of a single layer configured by any one of an inorganic material and an organic material in order to suppress the damage of the light emitting diode caused by impurities such as alkali ions leaked from the substrate SUB during a subsequent process. In contrast, the buffer layer BUF may be formed of a multi-layer formed of different inorganic materials. Further, the buffer layer BUF may also be formed of a multi-layer formed of an organic layer and an inorganic layer. The inorganic material may include any one of a silicon oxide layer SiOx, a silicon nitride layer SiNx, and a silicon oxy nitride layer SiON. The organic material may include any one of polyimide, benzocyclobutene series resin, and polyacrylate. An example of polyacrylate may include photo acryl. The first transistor T1 which is a driving transistor in each sub-pixel SP is disposed in the active area AA on the substrate SUB.

The first transistor T1 includes a first node electrode NE1 corresponding to a gate electrode, a second node electrode NE2 corresponding to a source electrode or a drain electrode, a third node electrode NE3 corresponding to a drain electrode or a source electrode, a semiconductor layer SEM1, and the like.

The first node electrode NE1 and the semiconductor layer SEM1 may overlap with a gate insulating layer GI therebetween. The second node electrode NE2 is formed on an interlayer insulating layer ILD to be in contact with one side of the semiconductor layer SEM1 and the third node electrode NE3 is formed on the interlayer insulating layer ILD to be in contact with the other side of the semiconductor layer SEM1.

An insulating layer INS which covers the second node electrode NE2, the third node electrode NE3, and a data line may be disposed. The insulating layer INS may be formed of a single layer formed of an inorganic material or a multi-layer formed of different inorganic materials. For example, the insulating layer INS may be formed of a single layer of any one of a silicon oxide layer SiOx, a silicon nitride layer SiNx, and a silicon oxy nitride layer SiON or a multi-layer thereof.

A planarization layer PLN may be disposed on the insulating layer INS. The planarization layer PLN is formed to relieve a step of a lower structure and protect the lower structure and is formed of an organic material layer. The organic material may include any one of polyimide, benzocyclobutene series resin, and polyacrylate. An example of polyacrylate may include photo acryl.

The light emitting diode ED may include a first electrode E1 corresponding to an anode electrode (or a cathode electrode), an emission layer EL formed on the first electrode E1, and a second electrode E2 corresponding to a cathode electrode (or an anode electrode) formed on the emission layer EL.

The first electrode E1 is electrically connected to the second node electrode NE2 of the first transistor T1 which is exposed through a pixel contact hole which passes through the planarization layer PLN.

A bank BANK having an opening which exposes the first electrode E1 may be formed on the planarization layer PLN. The opening of the bank BANK may be an area which defines an emission area. The bank BANK may be formed of an organic material such as polyimide, benzocyclobutene series resin, or polyacrylate. A spacer SPC may be formed on the bank BANK. The spacer SPC may serve to avoid the contact of the mask used for a subsequent process of manufacturing an emission layer EL with a laminated material below the spacer SPC. The spacer SPC may be manufactured simultaneously with the bank BANK using a half-tone mask during the manufacturing of the bank BANK.

Accordingly, the spacer SPC may be formed of the same material as the bank BANK and formed as one body with the bank BANK.

The above-described spacer SPC may be disposed anywhere above the bank BANK. For example, the spacer SPC may be disposed on the entire upper portion of the bank BANK and in this case, the width of the spacer SPC may be smaller than that of the bank BANK. Further, the spacer SPC may be disposed above the bank BANK with the width larger than that of the bank BANK and in this case, the spacer SPC may partially overlap the emission area. Further, the spacer SPC may be disposed above a part of the bank BANK. For example, the spacer SPC may be disposed on the entire bank BANK which encloses one sub-pixel, or the spacers may be disposed to be adjacent with one sub-pixel therebetween. Further, the spacers SPC may be disposed to be adjacent with at least two sub-pixels therebetween.

The emission layer EL is formed on the first electrode E1 of the emission area provided by the bank BANK. The emission layer EL may be formed by laminating a hole-related layer, an emission layer, and an electron-related layer on the first electrode E1 in this order or in a reverse order. The second electrode E2 is disposed to be opposite to the first electrode E1 with the emission layer EL therebetween.

The encapsulation unit ENCAP blocks or at least reduces permeation of moisture or oxygen into the light emitting diode ED which is vulnerable to the moisture or oxygen from the outside.

Such an encapsulation unit ENCAP may be formed as one layer or as illustrated in FIG. 9, may be formed by a plurality of layers PAS1, PCL, and PAS2.

For example, when the encapsulation unit ENCAP is formed of a plurality of layers PAS1, PCL, and PAS2, the encapsulation unit ENCAP may include one or more inorganic encapsulation layers PAS1 and PAS2 and one or more organic encapsulation layers PCL. As a specific example, the encapsulation unit ENCAP may have a structure in which a first inorganic encapsulation layer PAS1, an organic encapsulation layer PCL, and a second inorganic encapsulation layer PAS2 are sequentially laminated.

Here, the organic encapsulation layer PCL may further include at least one organic encapsulation layer or at least one inorganic encapsulation layer.

The first inorganic encapsulation layer PAS1 is formed on the substrate SUB on which the second electrode E2 corresponding to the cathode electrode is formed so as to be most adjacent to the light emitting diode ED. The first inorganic encapsulation layer PAS1 is formed of an inorganic insulating material on which low-temperature deposition is allowed, such as silicon nitride SiNx, silicon oxide SiOx, silicon oxynitride SiON, or aluminum oxide $Al_2O_3$. Since the first inorganic encapsulation layer PAS1 is deposited in a low temperature atmosphere, the first inorganic encapsulation layer PAS1 may suppress the damage of the emission layer EL including an organic material which is vulnerable to a high temperature atmosphere during a deposition process.

The organic encapsulation layer PCL is formed to have a smaller area than the first inorganic encapsulation layer PAS1 and in this case, the organic encapsulation layer PCL may be formed to expose both ends of the first inorganic encapsulation layer PAS1. The organic encapsulation layer PCL may serve as a buffer which relieves a stress between layers due to the bending of the light emitting display device with an integrated touch screen which is an organic light emitting display device and also serve to enhance a planarization performance. For example, the organic encapsulation layer PCL is formed of an organic insulating material, such as acrylic resin, epoxy resin, polyimide, polyethylene, or silicon oxy carbon SiOC.

In the meantime, when the organic encapsulation layer PCL is formed by an inkjet manner, one or more dams DAM may be formed in a boundary area of the non-active area NA and the active area AA or the dam area DA corresponding to a partial area in the non-active area NA.

As described above, the dam DAM functions to suppress the overflowing of the organic encapsulation layer PCL included in the encapsulation unit ENCAP to the outside. Therefore, the higher the height of the dam DAM, the easier the control of the overflowing of the organic encapsulation layer PCL. However, according to the exemplary embodiment of the present disclosure, in the display device in which the touch panel is integrally formed in the display panel DISP, when the touch electrode or the touch routing line is formed, there may be a high possibility of defects that the wiring line becomes thinner or disconnected in an area having a high step, like an area of the lower layer where the dam DAM is disposed. Therefore, in order to reduce the influence for forming a touch electrode or a touch routing line, it is important to adjust the height of the dam DAM. In order to reduce the step of the lower layer, the height of the dam DAM is reduced, and a plurality of dams DAM may be disposed.

For example, as illustrated in FIG. 9, the dam area DA is located between a pad area of the non-active area NA in which a plurality of X-touch pads X-TP and a plurality of Y-touch pad Y-TP are formed and the active area AA. In such a dam area DA, there may be a primary dam DAM1 adjacent to the active area AA and a secondary dam DAM2 adjacent to the pad area.

One or more dams DAM disposed in the dam area DA may suppress collapse of a liquefied organic encapsulation layer PCL toward the non-active area NA to invade the pad area when the liquefied organic encapsulation layer PCL is dropped in the active area AA.

This effect, as illustrated in FIG. 9, may be further enhanced when the primary dam DAM1 and the secondary dam DAM2 are provided.

The primary dam DAM1 and/or the secondary dam DAM2 may be formed with a single-layered or multi-layered structure. For example, the primary dam DAM1 and/or the secondary dam DAM2 may be formed simultaneously with the same material as at least one of the planarization layer PLN, the bank BANK, and the spacer SPC. In this case, the dam structure may be formed without having the mask adding process and increasing the cost.

Further, as illustrated in FIG. 9, the primary dam DAM1 and/or the secondary dam DAM2 may be formed with a structure in which the first inorganic encapsulation layer PAS1 and/or the second inorganic encapsulation layer PAS2 are laminated on the bank BANK.

Further, the organic encapsulation layer PCL including an organic material, as illustrated in FIG. 9, may be located only on an inner surface of the primary dam DAM1.

In contrast, the organic encapsulation layer PCL including an organic material may also be located above at least a part of the primary dam DAM1 and the secondary dam DAM2. For example, the organic encapsulation layer PCL may be located above the primary dam DAM1.

The second inorganic encapsulation layer PAS2 may be formed on the substrate SUB on which the organic encapsulation layer PCL is formed to cover an upper surface and a side surface of each of the organic encapsulation layer PCL and the first inorganic encapsulation layer PAS1. The second inorganic encapsulation layer PAS2 may reduce or block the permeation of the external moisture or oxygen into the first inorganic encapsulation layer PAS1 and the organic encapsulation layer PCL. Such a second inorganic encapsulation layer PAS2 is formed of an inorganic insulating material, such as silicon nitride SiNx, silicon oxide SiOx, silicon oxynitride SiON, or aluminum oxide $Al_2O_3$.

A touch buffer layer T-BUF may be disposed on the encapsulation unit ENCAP. The touch buffer layer T-BUF may be located between a touch sensor metal including X, Y-touch electrodes X-TE and Y-TE and X, Y-touch electrode connection lines X-CL and Y-CL and the second electrode E2 of the light emitting diode ED.

The touch buffer layer T-BUF may be designed to maintain a distance between the touch sensor metal and the second electrode E2 of the light emitting diode ED to a predetermined minimum distance (for example, 1 μm). Accordingly, a parasitic capacitance formed between the touch sensor metal and the second electrode E2 of the light emitting diode ED may be reduced or suppressed and thus the touch sensitivity degradation due to the parasitic capacitance may be suppressed.

The touch sensor metal including the X, Y-touch electrodes X-TE and Y-TE and the X, Y-touch electrode connection lines X-CL and Y-CL may be disposed without providing the touch buffer layer T-BUF.

Further, the touch buffer layer T-BUF may suppress the permeation of a chemical solution (a developer, an etchant, or the like) used for a manufacturing process of a touch sensor metal disposed on the touch buffer layer T-BUF, moisture from the outside, or the like, into the emission layer EL including an organic material. By doing this, the touch buffer layer T-BUF may suppress the damage of the emission layer EL which is vulnerable to the chemical solution or the moisture.

The touch buffer layer T-BUF may be formed of an organic insulating material which is formed at a low temperature of a predetermined temperature (for example, 100° C.) or lower to suppress the damage of the emission layer EL including an organic material which is vulnerable to a high temperature. The organic insulating material has a low permittivity of 1 to 3. For example, the touch buffer layer T-BUF may be formed of acrylic-, epoxy-, or siloxane-based material. The touch buffer layer T-BUF which is formed of an organic insulating material and has a planarization performance may suppress the damage of the encapsulation layers PAS1, PCL, and PAS2 which configure the encapsulation unit ENCAP in accordance with the bending of the organic light emitting display device. Further, the touch buffer layer T-BUF may suppress the crack of the touch sensor metal formed on the touch buffer layer T-BUF.

According to a mutual-capacitance-based touch sensor structure, the X-touch electrode line X-TEL and the Y-touch electrode line Y-TEL are disposed on the touch buffer layer T-BUF and the X-touch electrode line X-TEL and the Y-touch electrode line Y-TEL are disposed to intersect each other.

The Y-touch electrode line Y-TEL may include a plurality of Y-touch electrodes Y-TE and a plurality of Y-touch electrode connection lines Y-CL which electrically connects between the plurality of Y-touch electrodes Y-TE.

As illustrated in FIG. 9, the plurality of Y-touch electrodes Y-TE and the plurality of Y-touch electrode connection lines Y-CL may be disposed on different layers with a touch insulating layer T-ILD therebetween.

The plurality of Y-touch electrodes Y-TE may be spaced apart from each other along a y-axis direction with a predetermined distance. Each of the plurality of Y-touch electrodes Y-TE may be electrically connected to another Y-touch electrode Y-TE which is adjacent in a y-axis direction by means of the Y-touch electrode connection line Y-CL.

The Y-touch electrode connection line Y-CL is formed on the touch buffer layer T-BUF and is exposed through a touch contact hole which passes through the touch insulating layer T-ILD to be electrically connected to two Y-touch electrodes Y-TE adjacent in the y-axis.

The Y-touch electrode connection line Y-CL may be disposed so as to overlap the bank BANK. Accordingly, the degradation of an aperture rate may be suppressed by the Y-touch electrode connection line Y-CL.

The X-touch electrode line X-TEL may include a plurality of X-touch electrodes X-TE and a plurality of X-touch electrode connection lines X-CL which electrically connects between the plurality of X-touch electrodes X-TE.

The plurality of X-touch electrodes X-TE may be spaced apart from each other along an x-axis direction with a predetermined distance on the touch insulating layer T-ILD. Each of the plurality of X-touch electrodes X-TE may be electrically connected to another X-touch electrode X-TE which is adjacent in an x-axis direction by means of the X-touch electrode connection line X-CL.

The X-touch electrode connection line X-CL is disposed on the same plane as the X-touch electrode X-TE to be electrically connected to two X-touch electrodes X-TE adjacent in the x-axis direction without having a separate contact hole or to be formed as one body with two X-touch electrodes X-TE adjacent in the x-axis direction.

The X-touch electrode connection line X-CL may be disposed so as to overlap the bank BANK. Accordingly, the degradation of an aperture rate may be suppressed by the X-touch electrode connection line X-CL.

In the meantime, the Y-touch electrode line Y-TEL may be electrically connected to the touch driving circuit TDC by means of the Y-touch routing line Y-TL and the Y-touch pad Y-TP. Similarly, the X-touch electrode line X-TEL may be electrically connected to the touch driving circuit TDC by means of the X-touch routing line X-TL and the X-touch pad X-TP.

A pad cover electrode which covers the X-touch pad X-TP and the Y-touch pad Y-TP may be further disposed.

The X-touch pad X-TP may be separately formed from the X-touch routing line X-TL or may be formed by extending the X-touch routing line X-TL. The Y-touch pad Y-TP may be separately formed from the Y-touch routing line Y-TL or may be formed by extending the Y-touch routing line Y-TL.

When the X-touch pad X-TP is formed by extending the X-touch routing line X-TL and the Y-touch pad Y-TP is formed by extending the Y-touch routing line Y-TL, the X-touch pad X-TP, the X-touch routing line X-TL, the Y-touch pad Y-TP, and the Y-touch routing line Y-TL may be configured by the same first conductive material. Here, the first conductive material may be formed with a single-layered or a multilayered structure using a metal having a strong corrosion resistance and acid resistance and having a good conductivity, such as Al, T1, Cu, or Mo.

For example, the X-touch pad X-TP, the X-touch routing line X-TL, the Y-touch pad Y-TP, and the Y-touch routing line Y-TL formed of the first conductive material may each be formed with a laminated triple-layered structure such as Ti/Al/Ti or Mo/Al/Mo.

The pad cover electrode which covers X-touch pad X-TP and the Y-touch pad Y-TP may be configured with a second conductive material which is the same material as the X and Y-touch electrodes X-TE and Y-TE. Here, the second conductive material may be formed by a transparent conductive material having strong corrosion resistance and acid resistance such as ITO or IZO. Such a pad cover electrode is formed to be exposed by the touch buffer layer T-BUF to be bonded with the touch driving circuit TDC or bonded with a circuit film in which the touch driving circuit TDC is mounted.

Here, a cover organic layer C-PAC is formed to cover the touch sensor metal to suppress the corrosion of the touch sensor metal due to the moisture from the outside. For example, the cover organic layer C-PAC may be formed of an organic insulating material or formed in the form of a circular polarizing plate or an epoxy or acrylic film. Such a cover organic layer C-PAC may not be provided on the encapsulation unit ENCAP. That is, the cover organic layer C-PAC may not be an essential component.

The Y-touch routing line Y-TL may be electrically connected to the Y-touch electrode Y-TE through a touch routing line contact hole or may be formed as one body with the Y-touch electrode Y-TE.

Such a Y-touch routing line Y-TL extends to the non-active area NA and passes through an upper portion and a side surface of the encapsulation unit ENCAP and an upper portion and a side surface of the dam DAM to be electrically connected to the Y-touch pad Y-TP. Accordingly, the Y-touch routing line Y-TL may be electrically connected to the touch driving circuit TDC by means of the Y-touch pad Y-TP.

The Y-touch routing line Y-TL may transmit a touch sensing signal from the Y-touch electrode Y-TE to the touch driving circuit TDC or may be supplied with the touch driving signal from the touch driving circuit TDC to transmit the touch driving signal to the Y-touch electrode Y-TE.

The X-touch routing line X-TL may be electrically connected to the X-touch electrode X-TE through the touch routing line contact hole or may be formed as one body with the X-touch electrode X-TE.

Such an X-touch routing line X-TL extends to the non-active area NA and passes through an upper portion and a side surface of the encapsulation unit ENCAP and an upper portion and a side surface of the dam DAM to be electrically connected to the X-touch pad X-TP. Accordingly, the X-touch routing line X-TL may be electrically connected to the touch driving circuit TDC by means of the X-touch pad X-TP.

The X-touch routing line X-TL may be supplied with the touch driving signal from the touch driving circuit TDC to transmit the touch driving signal to the X-touch electrode X-TE or may transmit a touch sensing signal from the X-touch electrode X-TE to the touch driving circuit TDC.

The arrangement of the X-touch routing line X-TL and the Y-touch routing line Y-TL may be changed in various manners depending on a panel design specification.

An organic cover layer C-PAC may be disposed on the X-touch electrode X-TE and the Y-touch electrode Y-TE. The organic cover layer C-PAC extends before or after the dam DAM to be disposed also on the X-touch routing line X-TL and the Y-touch routing line Y-TL.

In the meantime, the cross-sectional view of FIG. 9 conceptually illustrates a structure. Therefore, a position, a thickness, or a width of each pattern (various layers or various electrodes) may vary depending on a watching direction or position. Further, additional layer may be further provided in addition to the plurality of illustrated layers and some of the plurality of illustrated layers may be omitted or combined. For example, the width of the bank BANK may be narrower than that in the drawing or a height of the dam DAM may be higher or lower than that in the drawing. Further, the cross-sectional view of FIG. 9 illustrates a structure in which the touch electrode TE and the touch routing line TL are disposed on the entire sub-pixel SP to illustrate an example of a structure connected to the touch pad TP along an inclined surface of the touch routing line TL and the encapsulation unit ENCAP. However, when the touch electrode TE is a mesh type as described above, a hole of the touch electrode TE may be located on the emission area of the sub-pixel SP. A color filter CF may be further disposed on the encapsulation unit ENCAP and the color filter may be located on the touch electrode TE or located between the encapsulation unit ENCAP and the touch electrode TE.

Figure 10:
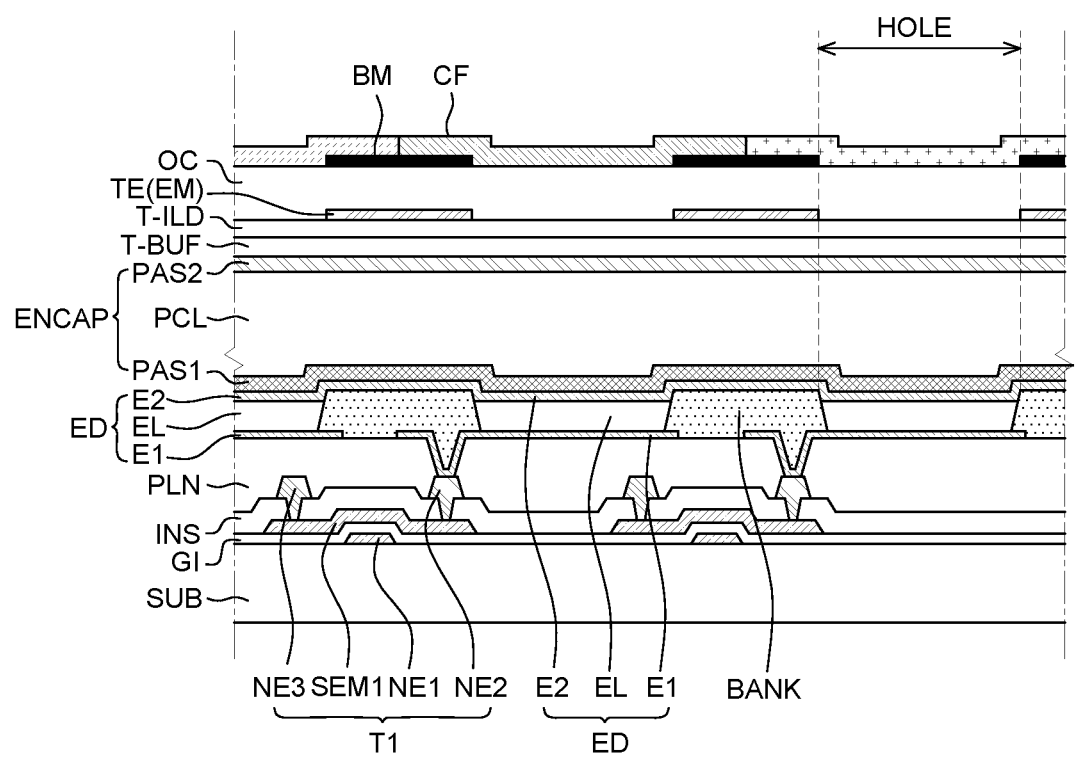
FIGS. 10 and 11 are exemplary views illustrating a cross-sectional structure in which a color filter is included in a display panel according to exemplary embodiments of the present disclosure.
Figure 11:
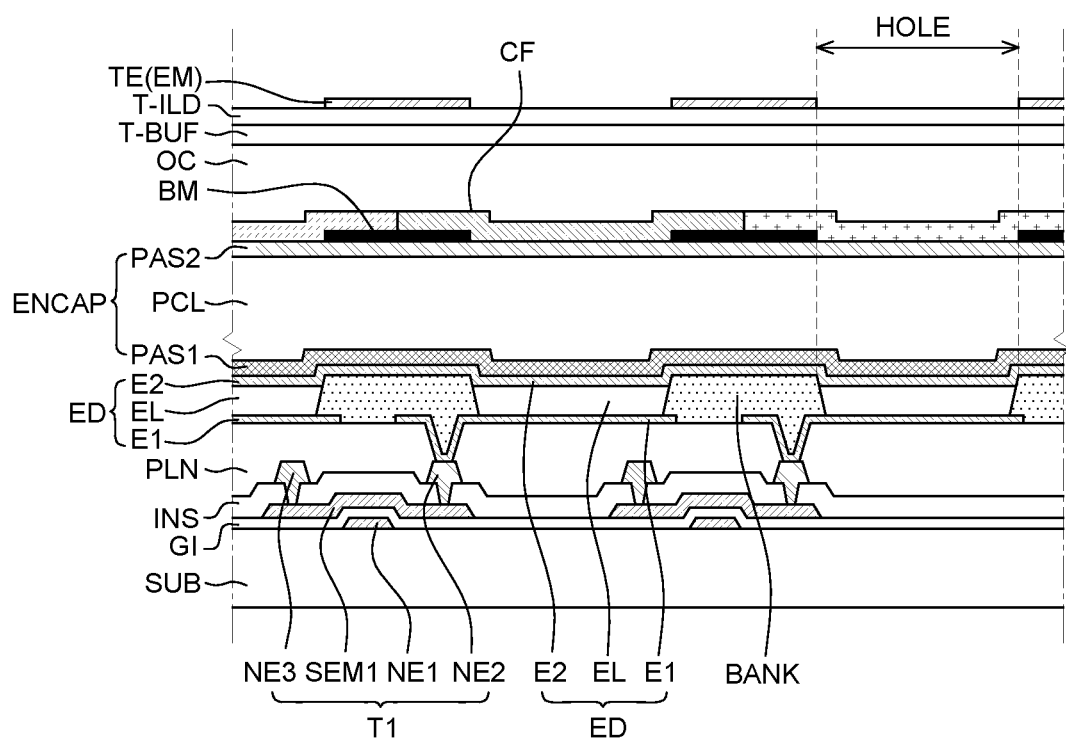

FIGS. 10 and 11 are exemplary views illustrating a cross-sectional structure in which a color filter CF is included in a display panel DISP according to exemplary embodiments of the present disclosure.

Referring to FIGS. 10 and 11, when the touch panel TSP is embedded in the display panel DISP and the display panel DISP is implemented as an organic light emitting display panel, the touch panel TSP may be located on the encapsulation unit ENCAP in the display panel DISP. In other words, a touch sensor metal such as a plurality of touch electrodes TE and a plurality of touch routing lines TL may be disposed on the encapsulation unit ENCAP in the display panel DISP.

As described above, the touch electrode TE is formed on the encapsulation unit ENCAP so that the touch electrode TE may be formed without significantly affecting the display performance and formation of display-related layer.

In the meantime, referring to FIGS. 10 and 11, the second electrode E2 which may serve as a cathode electrode of the organic light emitting diode OLED may be located below the encapsulation unit ENCAP.

For example, the thickness of the encapsulation unit ENCAP may be 1 μm or larger.

As described above, the thickness of the encapsulation unit ENCAP is designed to be 1 μm or larger so that a parasitic capacitance formed between the second electrode E2 of the organic light emitting diode OLED and the touch electrodes TE may be reduced. Accordingly, the degradation of the touch sensitivity due to the parasitic capacitance may be suppressed.

As described above, each of the plurality of touch electrodes TE may be patterned such that the electrode metal EM has a mesh pattern having two or more holes and each of two or more holes may correspond to one or more sub-pixels or an emission area thereof as seen from a vertical direction.

As described above, in plan view, the electrode metal EM of the touch electrode TE is patterned such that an emission area of one or more sub-pixel is located so as to correspond to a position of each of two or more holes in the area of the touch electrode TE. By doing this, the luminous efficiency of the display panel DISP may be increased.

As illustrated in FIGS. 10 and 11, in the display panel DISP, a black matrix BM may be disposed, and the color filter CF may be further disposed.

A position of the black matrix BM may correspond to a position of the electrode metal EM of the touch electrode TE.

A position of the plurality of color filters CF may correspond to the position of the plurality of touch electrodes TE or the electrode metal ME which forms the plurality of touch electrodes TE.

As described above, the plurality of color filters CF are located in a position corresponding to a position of a plurality of open areas HOLE so that the luminous performance of the display panel DISP may be increased.

A vertical position relationship between the plurality of color filters CF and the plurality of touch electrodes TE will be described as follows.

As illustrated in FIG. 10, a plurality of color filters CF and black matrixes BM may be located on the plurality of touch electrodes TE.

In this case, the plurality of color filters CF and black matrixes BM may be located on an overcoating layer OC disposed on the plurality of touch electrodes TE. Here, the overcoating layer OC may be the same layer as the organic cover layer C-PAC of FIG. 9 or a different layer from the organic cover layer C-PAC.

Alternatively, as illustrated in FIG. 11, the plurality of color filters CF and black matrixes BM may be located below the touch electrodes TE.

In this case, the plurality of touch electrodes TE may be located on the overcoating layer OC on the plurality of color filters CF and black matrixes BM. Here, the overcoating layer OC may be the same layer as the touch buffer layer T-BUF or the touch insulating layer T-ILD of FIG. 9 or a different layer. Alternatively, the touch buffer layer T-BUF or the touch insulating layer T-ILD may be disposed separately from the overcoating layer OC.

As described above, a configuration for touch sensing may be disposed by adjusting a vertical position relationship between the touch electrode TE and a configuration for display driving, without degrading the display performance.

In the meantime, the display panel DISP according to exemplary embodiments of the present disclosure may include a sensor such as a camera sensor or a proximity sensor. Such a sensor may be disposed in the non-active area NA of the display panel DISP, but may also be disposed in a partial area of the active area AA to reduce the non-active area NA.

That is, depending on a type of the display panel DISP, there may be an area in which an image is not displayed, but a sensor such as a camera sensor is disposed, in the active area AA.

Figure 12:
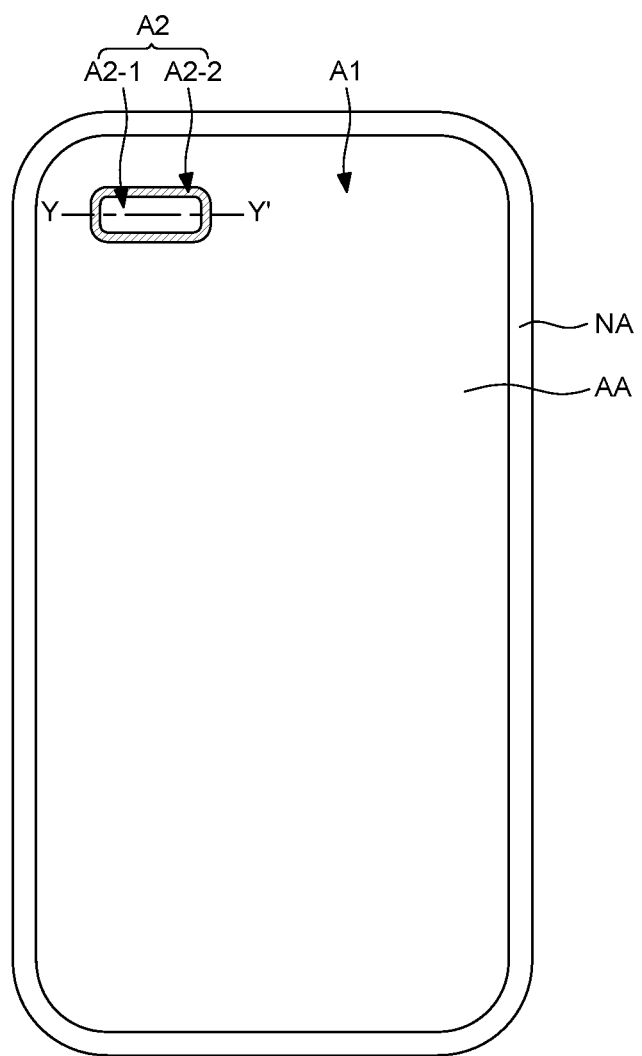
FIG. 12 is a view illustrating an example of a structure in which holes are disposed in an active area of a display panel according to exemplary embodiments of the present disclosure.

FIG. 12 is a view illustrating an example of a structure in which holes are disposed in an active area AA of a display panel DISP according to exemplary embodiments of the present disclosure.

Referring to FIG. 12, the display panel DISP may include an active area AA in which a sub-pixel SP and a touch electrode TE are disposed and a non-active area NA located at the outside of the active area AA.

The active area AA may include a first area A1 in which a sub-pixel SP is disposed and an image is displayed and a second area A2 in which a sensor such as a camera sensor is disposed and images are not displayed. The first area A1 may be referred to as a pixel area and a second area A2 may be referred to as a camera placement area.

The second area A2 may include an opening area A2-1 which passes through the substrate SUB and a boundary area A2-2 at the outside of the opening area A2-1. Further, in the second area A2, at least one opening area may be disposed and in the active area AA, at least one second area A2 may be disposed.

For example, in the second area A2, a first opening area and a second opening area which is spaced apart from the first opening area may be disposed. That is, in the second area A2, a plurality of opening areas may be disposed. Further, in the active area AA, a plurality of second areas A2 may be disposed. That is, in the active area AA, a plurality of cameras are disposed so that a plurality of second areas A2 may be disposed.

Figure 13:
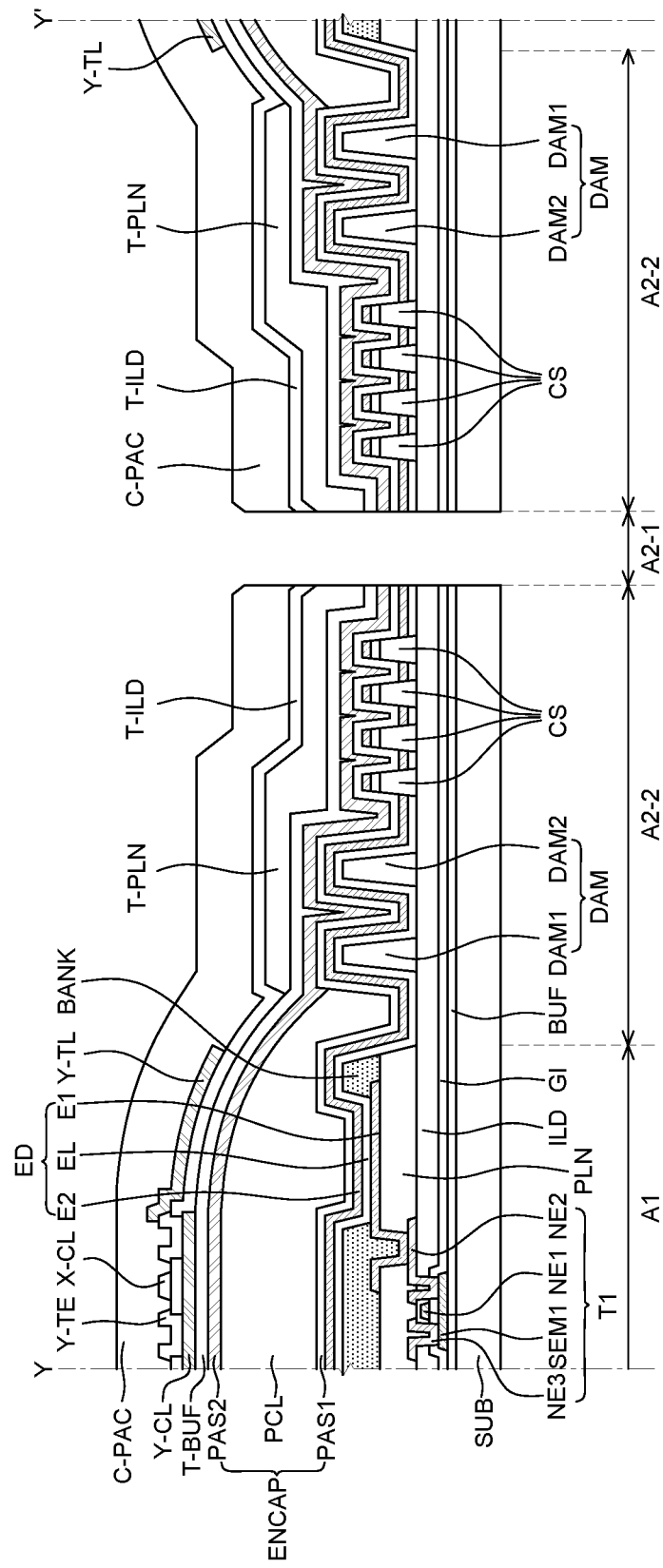
FIG. 13 is a view illustrating an example of a cross-sectional structure taken along the line Y-Y' of FIG. 12 according to one embodiment.

FIG. 13 is a cross-sectional view schematically illustrating a cross-section taken along the line Y-Y' of FIG. 12 according to one embodiment.

In FIG. 13, the same components as those in FIG. 9 are included so that the description of the same components will be omitted and only different components from those of FIG. 9 will be described.

The substrate SUB corresponding to the opening area A2-1 and functional layers there above are removed. Therefore, in the opening area A2-1, a through hole and an image capturing device (not illustrated) are located in a vertical direction. In this case, the removing process may be a punching process using laser. The image capturing device may be located below the substrate SUB in the opening area A2-1.

In the first area A1, the first transistor T1, the light emitting diode ED, and various functional layers are located on the substrate SUB.

The substrate SUB supports various components of the light emitting display device with an integrated touch screen. The substrate SUB may be formed of a transparent insulating material, for example, an insulating material such as glass or plastic.

The buffer layer BUF may be located on the substrate SUB. The buffer layer BUF is a functional layer for protecting the thin film transistor TFT from impurities such as alkali ions which are leaked from the substrate SUB or layers there below. The buffer layer BUF may be formed of silicon oxide SiOx, silicon nitride SiNx, or multiple layers thereof. The buffer layer BUF may include a multi buffer and/or an active buffer.

The first transistor T1 is located on the substrate SUB or the buffer layer BUF. The first transistor T1 includes a first node electrode NE1 corresponding to a gate electrode, a second node electrode NE2 corresponding to a source electrode or a drain electrode, a third node electrode NE3 corresponding to a drain electrode or a source electrode, a semiconductor layer SEM1, and the like.

The semiconductor layer SEM1 may be made of poly silicon p-Si. In this case, a predetermined region may be doped with impurities. Further, the semiconductor layer SEM1 may be made of amorphous silicon a-Si or various organic semiconductor materials such as pentacene. Moreover, the semiconductor layer SEM1 may be made of oxide.

The gate electrode NE1 may be formed of various conductive materials, for example, magnesium Mg, aluminum Al, nickel Ni, chrome Cr, molybdenum Mo, tungsten W, gold Au, or an alloy thereof.

The gate insulating layer GI and the interlayer insulating layer ILD may be formed of an insulating material such as silicon oxide SiOx or silicon nitride SiNx, or an insulating organic material. The gate insulating layer GI and the interlayer insulating layer ILD are selectively removed to form a contact hole through which the source and drain regions are exposed.

The source and drain electrodes NE2 and NE3 may be formed on the gate insulating layer GI or the interlayer insulating layer ILD as a single layer or multiple layers. If necessary, a passivation layer INS which is configured with an inorganic insulating material may cover the source and drain electrodes NE2 and NE3.

The planarization layer PLN may be located on the first transistor T1. The planarization layer PLN protects the first transistor T1 and planarizes an upper portion thereof. The planarization layer PLN may be configured to have various shapes. The planarization layer PLN may be modified in various ways, for example, the planarization layer may be formed of an organic insulating layer such as benzocyclobutene (BCB) or acryl, or an inorganic insulating layer such as a silicon nitride layer SiNx or a silicon oxide layer SiOx or may be formed of a single layer or double layers or multiple layers.

The light emitting diode ED may include a first electrode E1 corresponding to an anode electrode (or a cathode electrode), an emission layer EL formed on the first electrode E1, and a second electrode E2 corresponding to a cathode electrode (or an anode electrode) formed on the emission layer EL.

The first electrode E1 is electrically connected to the second node electrode NE2 of the first transistor T1 which is exposed through a pixel contact hole which passes through the planarization layer PLN.

The bank BANK is formed in a remaining area except for an emission area. Therefore, the bank BANK has a bank hole which exposes the first electrode E1 corresponding to the emission area. The bank BANK may be formed of an organic material such as polyimide, benzocyclobutene series resin, or polyacrylate. A spacer SPC may be formed on the bank BANK. The spacer SPC may serve to suppress the contact of the mask used for a subsequent process of manufacturing an emission layer EL with a laminated material below the spacer SPC. The spacer SPC may be manufactured simultaneously with the bank BANK using a halftone mask during the manufacturing of the bank BANK. Accordingly, the spacer SPC may be formed of the same material as the bank BANK and formed as one body with the bank BANK.

The above-described spacer SPC may be disposed anywhere above the bank BANK. For example, the spacer SPC may be disposed on the entire upper portion of the bank BANK and in this case, the width of the spacer SPC may be smaller than that of the bank BANK. Further, the spacer SPC may be disposed above the bank BANK with the width larger than that of the bank BANK and in this case, the spacer SPC may partially overlap the emission area. Further, the spacer SPC may be disposed above a part of the bank BANK. For example, the spacer SPC may be disposed on the entire bank BANK which encloses one sub-pixel or may be disposed to be adjacent with one sub-pixel therebetween. Further, the spacers SPC may be disposed to be adjacent with at least two sub-pixels therebetween.

The emission layer EL is located on the first electrode E1. The emission layer EL may include an electron injection layer, an electron transport layer, an emission layer, a hole transport layer, a hole injection layer, and the like. The above-described layers may be formed on the entire first area A1 or only in a partial area of the first area A1 depending on the necessity or the process. The emission layer EL may be configured with a single emission layer structure which emits single light or may be configured with a structure which is configured by a plurality of emission layers to emit white light. The emission layer EL may not be formed in the opening area A2-1 using a disconnected structure illustrated in FIG. 13.

The second electrode E2 is located on the emission layer EL. When the light emitting display device with an integrated touch screen is a top emission type, the second electrode E2 is formed of a transparent conductive material such as indium tin oxide ITO or indium zinc oxide IZO to emit light generated in the emission layer EL to an upper portion of the second electrode E2. The second electrode E2 may be a cathode of the light emitting diode ED.

The encapsulation unit ENCAP blocks or at least reduces permeation of moisture or oxygen into the light emitting diode ED which is vulnerable to the moisture or oxygen from the outside.

Such an encapsulation unit ENCAP may be formed as one layer or as illustrated in FIG. 9, may be formed by a plurality of layers PAS1, PCL, and PAS2.

For example, when the encapsulation unit ENCAP is formed of a plurality of layers PAS1, PCL, and PAS2, the encapsulation unit ENCAP may include one or more inorganic encapsulation layers PAS1 and PAS2 and one or more organic encapsulation layers PCL. As a specific example, the encapsulation unit ENCAP may have a structure in which a first inorganic encapsulation layer PAS1, an organic encapsulation layer PCL, and a second inorganic encapsulation layer PAS2 are sequentially laminated.

Here, the organic encapsulation layer PCL may further include at least one organic encapsulation layer or at least one inorganic encapsulation layer.

The first inorganic encapsulation layer PAS1 is formed on the substrate SUB on which the second electrode E2 corresponding to the cathode electrode is formed so as to be most adjacent to the light emitting diode ED. The first inorganic encapsulation layer PAS1 is formed of an inorganic insulating material on which low-temperature deposition is allowed, such as silicon nitride SiNx, silicon oxide SiOx, silicon oxynitride SiON, or aluminum oxide $Al_2O_3$. Since the first inorganic encapsulation layer PAS1 is deposited in a low temperature atmosphere, the first inorganic encapsulation layer PAS1 may suppress the damage of the emission layer EL including an organic material which is vulnerable to a high temperature atmosphere during a deposition process.

The organic encapsulation layer PCL is formed to have a smaller area than the first inorganic encapsulation layer PAS1 and in this case, the organic encapsulation layer PCL may be formed to expose both ends of the first inorganic encapsulation layer PAS1. The organic encapsulation layer PCL may serve as a buffer which relieves a stress between layers due to the bending of the light emitting display device with an integrated touch screen which is an organic light emitting display device and also serve to enhance a planarization performance. The organic encapsulation layer PCL is formed of an organic insulating material, such as acrylic resin, epoxy resin, polyimide, polyethylene, or silicon oxy carbon SiOC.

A touch buffer layer T-BUF may be disposed on the encapsulation unit ENCAP. The touch buffer layer T-BUF may be located between a touch sensor metal including X, Y-touch electrodes X-TE and Y-TE and X, Y-touch electrode connection lines X-CL and Y-CL and the second electrode E2 of the light emitting diode ED.

The touch buffer layer T-BUF may be designed to maintain a distance between the touch sensor metal and the second electrode E2 of the light emitting diode ED to a predetermined minimum distance (for example, 1 μm). Accordingly, a parasitic capacitance formed between the touch sensor metal and the second electrode E2 of the light emitting diode ED may be reduced or suppressed and thus the touch sensitivity degradation due to the parasitic capacitance may be suppressed.

The touch sensor metal including X, Y-touch electrodes X-TE and Y-TE and X, Y-touch electrode connection lines X-CL and Y-CL may be disposed without providing the touch buffer layer T-BUF.

Further, the touch buffer layer T-BUF may suppress the permeation of a chemical solution (a developer, an etchant, or the like) used for a manufacturing process of a touch sensor metal disposed on the touch buffer layer T-BUF, moisture from the outside, or the like, into the emission layer EL including an organic material. By doing this, the touch buffer layer T-BUF may suppress the damage of the emission layer EL which is vulnerable to the chemical solution or the moisture.

The touch buffer layer T-BUF may be formed of an organic insulating material which is formed at a low temperature of a predetermined temperature (for example, 100° C.) or lower to suppress the damage of the emission layer EL including an organic material which is vulnerable to a high temperature. The organic insulating material has a low permittivity of 1 to 3. For example, the touch buffer layer T-BUF may be formed of acrylic-, epoxy-, or siloxane-based material. The touch buffer layer T-BUF which is formed of an organic insulating material and has a planarization performance may suppress the damage of the encapsulation layers PAS1, PCL, and PAS2 which configure the encapsulation unit ENCAP in accordance with the bending of the organic light emitting display device. Further, the touch buffer layer T-BUF may suppress the crack of the touch sensor metal formed on the touch buffer layer T-BUF.

The X-touch electrode line X-TEL and the Y-touch electrode line Y-TEL are disposed above the first area A1 in which the sub-pixels SP are disposed and the image is displayed, as illustrated in FIG. 9, above the touch buffer layer T-BUF, and the X-touch electrode line X-TEL and the Y-touch electrode line Y-TEL are disposed to intersect each other.

The Y-touch electrode line Y-TEL may include a plurality of Y-touch electrode Y-TE and a plurality of Y-touch electrode connection lines Y-CL which electrically connects between the plurality of Y-touch electrodes Y-TE.

A cover organic layer C-PAC may be formed above the touch sensor metal including the X-touch electrode line X-TEL and the Y-touch electrode line Y-TEL so as to cover the touch sensor metal. The cover organic layer C-PAC may suppress or at least reduce the corrosion of the touch sensor metal due to the moisture from the outside. For example, the cover organic layer C-PAC may be formed of an organic insulating material or formed in the form of a circular polarizing plate or an epoxy or acrylic film.

A boundary area A2-2 does not include the light emitting diode ED, but includes a bypass line (not illustrated), a blocking structure DAM, a cut structure CS, and the like to cut the interaction between the first area A1 and the opening area A2-1.

The bypass line is configured such that various wiring lines which pass through the opening area A2-1 in a horizontal direction or a vertical direction extend to bypass the opening area A2-1. The bypass line may be configured on the same layer as the original line or a different layer therefrom.

The blocking structure DAM is provided to suppress or at least reduce the overflowing of the organic encapsulation layer PCL of the encapsulation unit ENCAP to the opening area A2-1. Even though in FIG. 13, it is illustrated that the flow of the organic encapsulation layer PCL is blocked by a blocking structure DAM1 which is disposed insider than the other blocking structure DAM2, between two blocking structures, the organic encapsulation layer PCL may pass over an inner blocking structure, but may be blocked by an outer blocking structure.

The cut structure CS is provided to disconnect the connection of the emission layer EL. When the emission layer EL is exposed to the outside, it may serve as a permeation path of the moisture. In the opening area A2-1, the emission layer EL may be exposed to the outside so that the cut structure CS is necessary.

In the boundary area A2-2 in which the light emitting diode ED is not formed, the touch sensor metal may not be disposed. In the boundary area A2-2 in which the touch sensor metal is not disposed, a touch planarization layer T-PLN may be disposed above the touch buffer layer T-BUF. The touch planarization layer T-PLN may serve to protect the emission layer EL which is cut by the cut structure CS in the boundary area A2-2 from the outside. The touch planarization layer T-PLN is formed of an organic insulating material, such as acrylic resin, epoxy resin, polyimide, polyethylene, or silicon oxy carbon SiOC.

A cover organic layer C-PAC which extends from the pixel area A1 may be formed above the touch planarization layer T-PLN.

Figure 14:
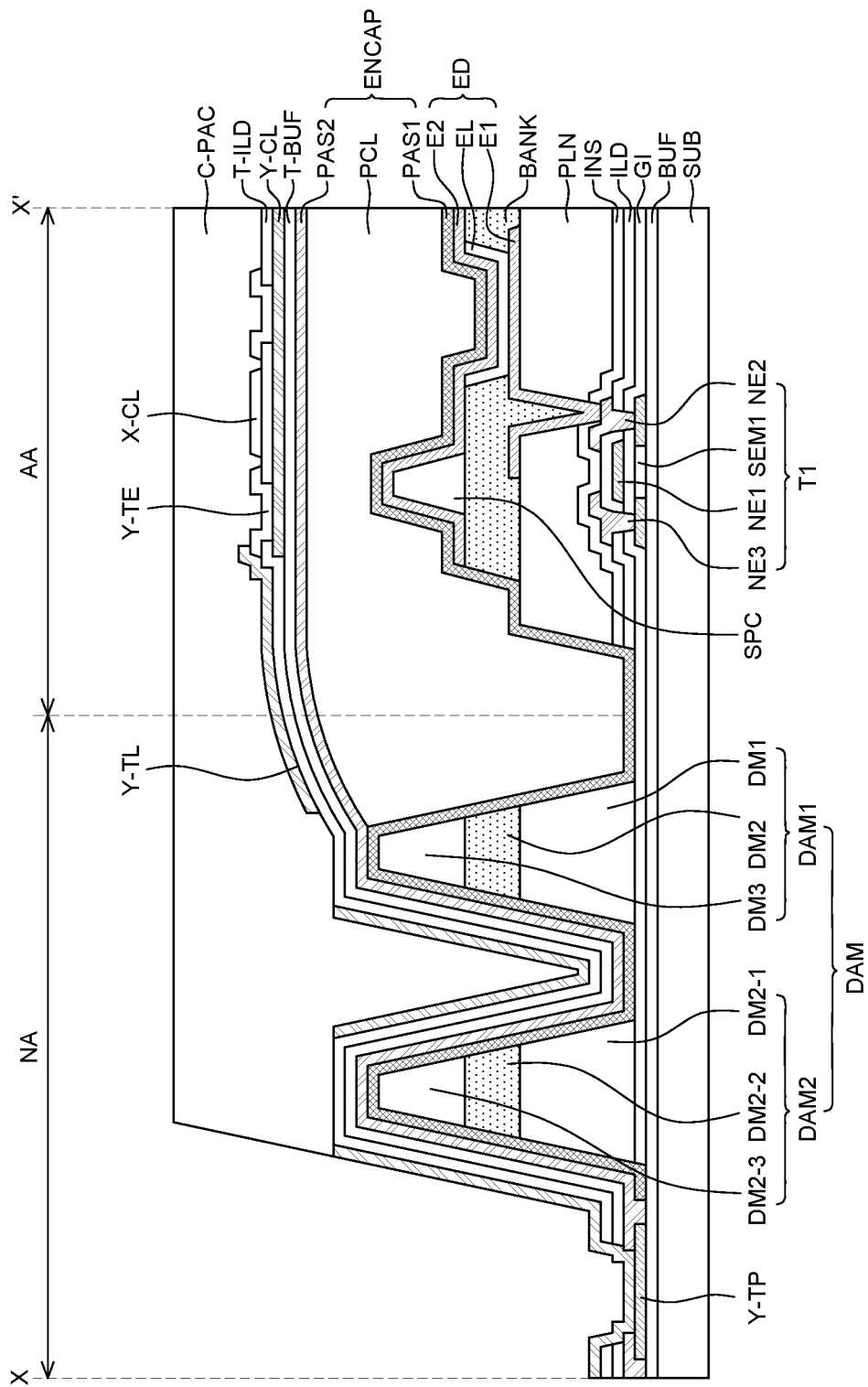
FIG. 14 is a view illustrating a cross-section taken along the line X-X' of FIG. 8 as another exemplary embodiment of the present disclosure.

FIG. 14 is a partial cross-sectional view of a display panel DISP according to another exemplary embodiments of the present disclosure, taken along the line X-X' of FIG. 8.

Referring to FIG. 14, in order to display colors, the organic light emitting display device forms sub-pixels to be divided into red, green, and blue sub-pixels and forms organic light emitting layers having a color of a corresponding sub-pixel in each sub-pixel. Generally, a deposition method using a shadow mask is used for the organic light emitting layer.

A large size shadow mask has a problem in that a sagging phenomenon is caused due to its load and thus, a yield is lowered when the shadow mask is used several times. Therefore, organic layers other than the emission layer may be commonly formed in each sub-pixel without being disconnected and without using the shadow mask.

However, in the structure which applies a common layer, in recent years, due to a common layer which is commonly provided for the sub-pixels, current flows to a side portion through a common layer which is continued on a plane so that a side leakage current problem is observed.

In order to suppress or at least reduce the side leakage current, a reverse spacer (not illustrated) having a reverse tapered shape may be provided above the bank BANK. When the emission layer EL which is deposited after forming the reverse spacer RAS is deposited, the emission layer is satisfactorily stacked on a flat portion due to the strong straightness. Specifically, however, when the emission layer encounters a structure in which a diameter of a lower portion is smaller than a diameter of an upper portion, like a reverse taper, the emission layer is not stacked on the side portion or partially disconnected to cause an isolated portion. In the meantime, the second electrode E2 provided above the emission layer EL has a metal component and is randomly deposited due to scattered reflection of the particles as compared with an organic material to have a good coverage. Therefore, the second electrode is also stacked on the side portion of the reverse spacer so that the isolated portion does not occur.

In the meantime, when a fine metal mask (for example, included in the case of the emission layer which is selectively formed for every sub-pixel) used during the process of depositing the emission layer EL is sagged due to its load, the fine metal mask serves as a primary support so as not to be in contact with the bank BANK or the reverse spacer. Therefore, the fine metal mask may be formed to be higher than the reverse spacer RAS.

That is, differently from the exemplary embodiment of FIG. 9, a height of the spacer SPC above the bank BANK in the active area AA and a height of the dam DAM of the non-active area NA including the same layer as the spacer SPC may be increased. As a result, as illustrated in FIG. 14, the Y-touch routing line Y-TL which passes through an area where the first dam DAM1 and the second dam DAM2 are formed is shorted due to a high step caused by the dam DAM. Therefore, the signal of the touch electrode is not transmitted to the touch driving circuit TDC so that there may be a problem in that a touch performance is lowered.

Accordingly, the inventors of the present disclosure recognized that a touch signal is cut due to the high step caused by the dam DAM disposed in the non-active area NA in a structure in which a touch panel TSP is embedded in the display panel DISP and an opening area for disposing a camera is included in the active area AA. Therefore, the inventors devised a new structure for connecting a touch routing line formed above the dam DAM.

Figure 15:
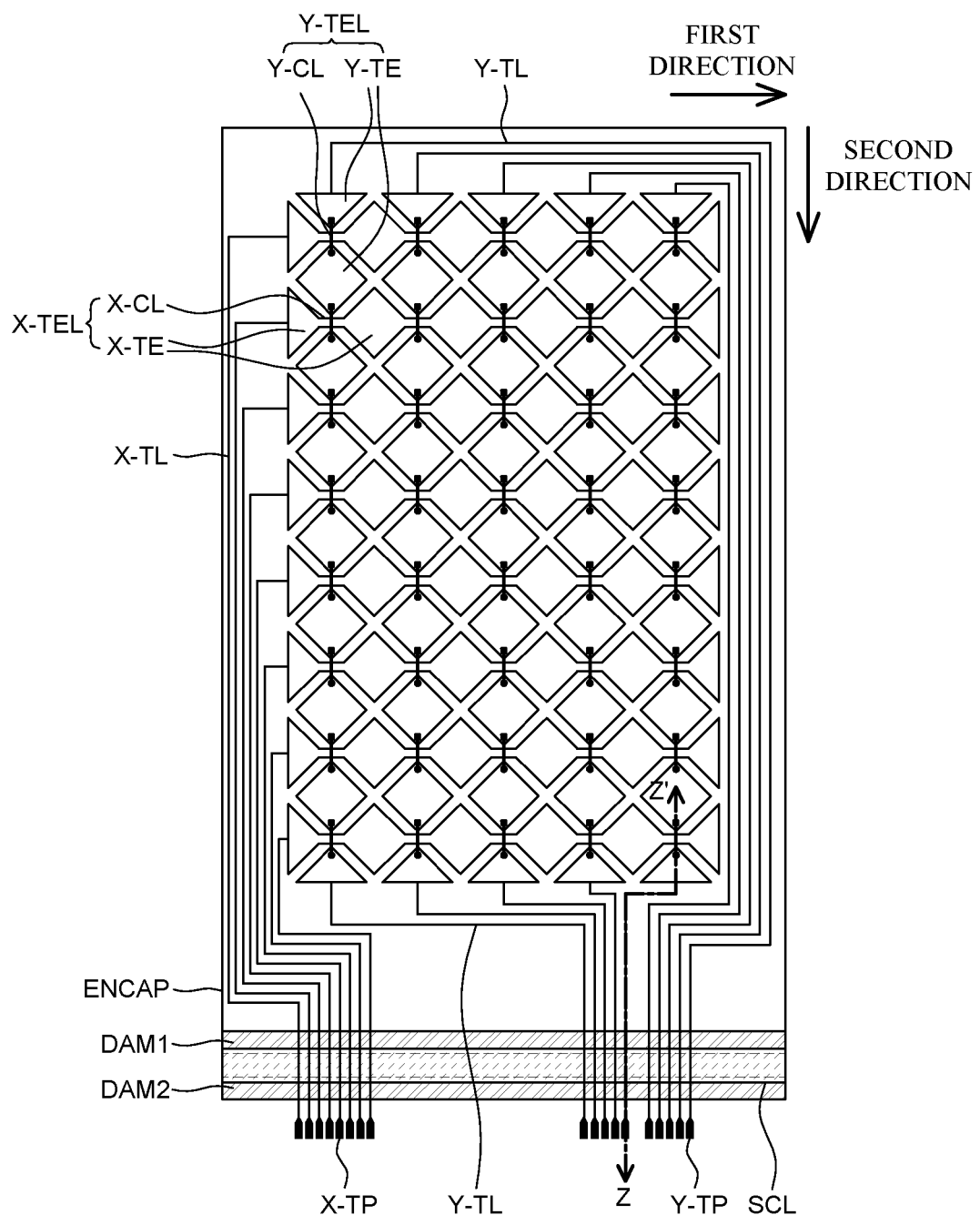
FIG. 15 is a plan view illustrating a light emitting display device with an integrated touch screen as an exemplary embodiment of the present disclosure.
Figure 16:
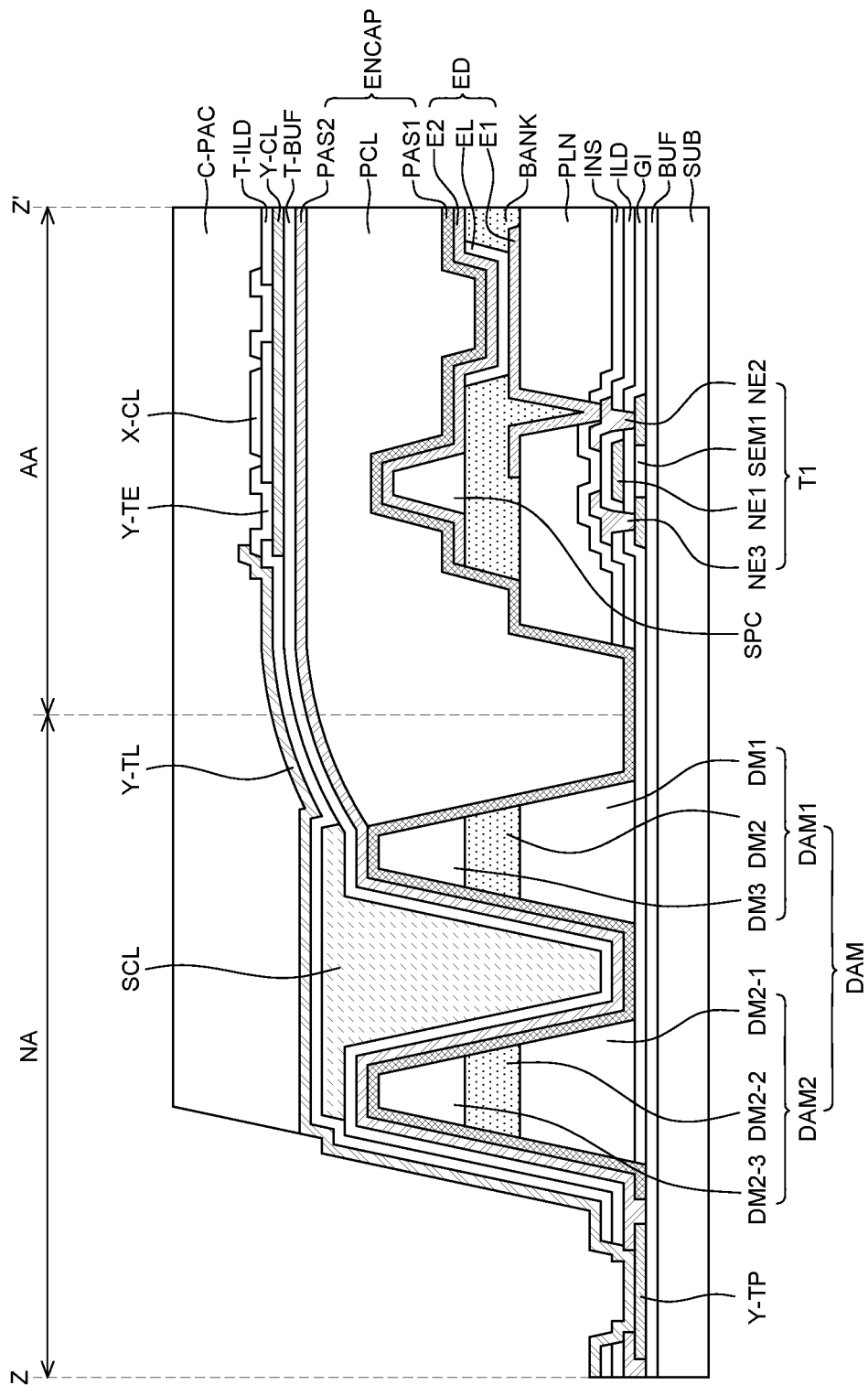
FIG. 16 is a view illustrating a cross-sectional structure taken along the line Z-Z' of FIG. 15 according to one embodiment.

FIG. 15 is a plan view illustrating a light emitting display device with an integrated touch screen according to an exemplary embodiment of the present disclosure. FIG. 16 is a view illustrating a cross-section taken along the line Z-Z' of FIG. 15 according to one embodiment.

Referring to FIGS. 15, and 16, the display panel DISP may include an active area AA in which a sub-pixel SP and a touch electrode TE are disposed and a non-active area NA located at the outside of the active area AA. The display panel DISP includes the same components and lamination structure as the display panel DISP of FIG. 3 as described above, so that a detailed description will be omitted.

A buffer layer BUF having a single-layered or a multi-layered structure may be disposed on a substrate SUB. The substrate SUB may be formed of a flexible material. When the substrate SUB is formed of a material such as polyimide, the buffer layer BUF may be formed of a single layer configured by any one of an inorganic material and an organic material to suppress the damage of the light emitting diode caused by impurities such as alkali ions leaked from the substrate SUB during a subsequent process. In contrast, the buffer layer BUF may be formed of a multi-layer formed of different inorganic materials. Further, the buffer layer BUF may be formed of a multi-layer formed of an organic material layer and an inorganic material layer. The inorganic material may include any one of a silicon oxide layer SiOx, a silicon nitride layer SiNx, and a silicon oxy nitride layer SiON. The organic material may include any one of polyimide, benzocyclobutene series resin, and polyacrylate. An example of polyacrylate may include photo acryl. The first transistor T1 which is a driving transistor is disposed in each sub-pixel SP in the active area AA on the substrate SUB.

The first transistor T1 includes a first node electrode NE1 corresponding to a gate electrode, a second node electrode NE2 corresponding to a source electrode or a drain electrode, a third node electrode NE3 corresponding to a drain electrode or a source electrode, and a semiconductor layer SEM1.

The first node electrode NE1 and the semiconductor layer SEM1 may overlap with a gate insulating layer GI therebetween. The second node electrode NE2 is formed on an interlayer insulating layer ILD to be in contact with one side of the semiconductor layer SEM1 and the third node electrode NE3 is formed on the interlayer insulating layer ILD to be in contact with the other side of the semiconductor layer SEM1.

An insulating layer INS which covers the second node electrode NE2, the third node electrode NE3, and a data line may be disposed. The insulating layer INS may be formed of a single layer formed of an inorganic material or a multi-layer formed of different inorganic materials. For example, the insulating layer INS may be formed of a single layer of any one of a silicon oxide layer SiOx, a silicon nitride layer SiNx, and a silicon oxy nitride layer SiON or a multi-layer thereof.

A planarization layer PLN may be disposed on the insulating layer INS. The planarization layer PLN is formed to relieve a step of a lower structure and protect the lower structure and is formed of an organic material layer. The organic material may include any one of polyimide, benzocyclobutene series resin, and polyacrylate. An example of polyacrylate may include photo acryl.

The light emitting diode ED may include a first electrode E1 corresponding to an anode electrode (or a cathode electrode), an emission layer EL formed on the first electrode E1, and a second electrode E2 corresponding to a cathode electrode (or an anode electrode) formed on the emission layer EL.

The first electrode E1 is electrically connected to the second node electrode NE2 of the first transistor T1 which is exposed through a pixel contact hole which passes through the planarization layer PLN.

A bank BANK having an opening which exposes the first electrode E1 may be formed on the planarization layer PLN. The opening of the bank BANK may be an area which defines an emission area. The bank BANK may be formed of an organic material such as polyimide, benzocyclobutene series resin, or polyacrylate. A spacer SPC may be formed on the bank BANK. The spacer SPC may serve to suppress the contact of the mask used for a subsequent process of manufacturing an emission layer EL with a laminated material below the spacer SPC. The spacer SPC may be manufactured simultaneously with the bank BANK using a half-tone mask during the manufacturing of the bank BANK. Accordingly, the spacer SPC may be formed of the same material as the bank BANK and formed as one body with the bank BANK.

The above-described spacer SPC may be disposed anywhere above the bank BANK. For example, the spacer SPC may be disposed on the entire upper portion of the bank BANK and in this case, the width of the spacer SPC may be smaller than that of the bank BANK. Further, the spacer SPC may be disposed above the bank BANK with the width larger than that of the bank BANK and in this case, the spacer SPC may partially overlap the emission area. Further, the spacer SPC may be disposed above a part of the bank BANK. For example, the spacer SPC may be disposed on the entire bank BANK which encloses one sub-pixel or may be disposed to be adjacent with one sub-pixel therebetween. Further, the spacers SPC may be disposed to be adjacent with at least two sub-pixels therebetween.

The emission layer EL is formed on the first electrode E1 of the emission area provided by the bank BANK. The emission layer EL may be formed by laminating a hole-related layer, an emission layer, and an electron-related layer on the first electrode E1 in this order or in a reverse order. The second electrode E2 is disposed to be opposite to the first electrode E1 with the emission layer EL therebetween.

The encapsulation unit ENCAP blocks moisture or oxygen from being permeated into the light emitting diode ED which is vulnerable to the moisture or oxygen from the outside.

Such an encapsulation unit ENCAP may be formed as one layer or as illustrated in FIG. 9, may be formed by a plurality of layers PAS1, PCL, and PAS2.

For example, when the encapsulation unit ENCAP is formed of a plurality of layers PAS1, PCL, and PAS2, the encapsulation unit ENCAP may include one or more inorganic encapsulation layers PAS1 and PAS2 and one or more organic encapsulation layer PCL. As a specific example, the encapsulation unit ENCAP may have a structure in which a first inorganic encapsulation layer PAS1, an organic encapsulation layer PCL, and a second inorganic encapsulation layer PAS2 are sequentially laminated.

Here, the organic encapsulation layer PCL may further include at least one organic encapsulation layer or at least one inorganic encapsulation layer.

The first inorganic encapsulation layer PAS1 is formed on the substrate SUB on which the second electrode E2 corresponding to the cathode electrode is formed so as to be most adjacent to the light emitting diode ED. The first inorganic encapsulation layer PAS1 is formed of an inorganic insulating material on which low-temperature deposition is allowed, such as silicon nitride SiNx, silicon oxide SiOx, silicon oxynitride SiON, or aluminum oxide $Al_2O_3$. Since the first inorganic encapsulation layer PAS1 is deposited in a low temperature atmosphere, the first inorganic encapsulation layer PAS1 may suppress the damage of the emission layer EL including an organic material which is vulnerable to a high temperature atmosphere during a deposition process.

The organic encapsulation layer PCL is formed to have a smaller area than the first inorganic encapsulation layer PAS1 and in this case, the organic encapsulation layer PCL may be formed to expose both ends of the first inorganic encapsulation layer PAS1. The organic encapsulation layer PCL may serve as a buffer which relieves a stress between layers due to the bending of the light emitting display device with an integrated touch screen which is an organic light emitting display device and also serve to enhance a planarization performance. The organic encapsulation layer PCL is formed of an organic insulating material, such as acrylic resin, epoxy resin, polyimide, polyethylene, or silicon oxy carbon SiOC.

The second inorganic encapsulation layer PAS2 may be formed on the substrate SUB on which the organic encapsulation layer PCL is formed to cover an upper surface and a side surface of each of the organic encapsulation layer PCL and the first inorganic encapsulation layer PAS1. The second inorganic encapsulation layer PAS2 may reduce or block the permeation of the external moisture or oxygen into the first inorganic encapsulation layer PAS1 and the organic encapsulation layer PCL. The second inorganic encapsulation layer PAS2 is formed of an inorganic insulating material, such as silicon nitride SiNx, silicon oxide SiOx, silicon oxynitride SiON, or aluminum oxide $Al_2O_3$.

In the non-active area NA, a first dam DAM1 and a second dam DAM2 may be disposed to enclose the active area AA. The first dam DAM1 is located to be adjacent to the active area AA and the second dam DAM2 may be located farther from the active area AA than the first dam DAM1. As described in detail in FIG. 2, the dam DAM may function to suppress the overflowing of the organic encapsulation layer PCL included in the encapsulation unit ENCAP to the outside. Therefore, the dam DAM may be referred to as a blocking structure. That is, the first dam DAM1 and the second dam DAM2 may be referred to as a first blocking structure and a second blocking structure, respectively.

The first blocking structure DAM1 and/or the second blocking structure DAM2 may be formed with a single-layered or multi-layered structure. For example, the first blocking structure DAM1 may include sequentially stacked blocking structures DM1, DM2 and DM3, and the second blocking structure DAM2 may include sequentially stacked blocking structures DAM2-1, DAM2-2 and DAM2-3. For example, the first blocking structure DAM1 and/or the second blocking structure DAM2 may be formed to be sequentially laminated with the same material as the planarization layer PLN, the bank BANK, and the spacer SPC.

The blocking structure DAM serves to suppress or at least reduce the overflowing of the organic encapsulation layer PCL so that the first blocking structure DAM1 adjacent to the active area AA and the second blocking structure DAM2 located to be more outside may not be formed with the same laminated structure. That is, the organic encapsulation layer PCL is primarily blocked by the first blocking structure DAM1 so that the second blocking structure DAM2 may be formed to be lower than the first blocking structure DAM1.

A touch buffer layer T-BUF may be disposed above the encapsulation unit ENCAP. The touch buffer layer T-BUF may be located between a touch sensor metal including X, Y-touch electrodes X-TE and Y-TE and X, Y-touch electrode connection lines X-CL and Y-CL and the second electrode E2 of the light emitting diode ED.

The touch buffer layer T-BUF may be designed to maintain a distance between the touch sensor metal and the second electrode E2 of the light emitting diode ED to a predetermined minimum distance (for example, 1 µm). Accordingly, a parasitic capacitance formed between the touch sensor metal and the second electrode E2 of the light emitting diode ED may be reduced or suppressed and thus the touch sensitivity degradation due to the parasitic capacitance may be suppressed.

In the active area AA, the X-touch electrode line X-TEL and the Y-touch electrode line Y-TEL are disposed on the touch buffer layer T-BUF and the X-touch electrode line X-TEL and the Y-touch electrode line Y-TEL are disposed to intersect each other.

The Y-touch electrode line Y-TEL may include a plurality of Y-touch electrode Y-TE and a plurality of Y-touch electrode connection lines Y-CL which electrically connects between the plurality of Y-touch electrodes Y-TE.

The plurality of Y-touch electrodes Y-TE and the plurality of Y-touch electrode connection lines Y-CL may be disposed on different layers with a touch insulating layer T-ILD therebetween.

The plurality of Y-touch electrodes Y-TE may be spaced apart from each other along a y-axis direction with a predetermined distance. Each of the Y-touch electrodes Y-TE may be electrically connected to another Y-touch electrode Y-TE which is adjacent in a y-axis direction by means of the Y-touch electrode connection line Y-CL.

The Y-touch electrode connection line Y-CL is formed on the touch buffer layer T-BUF and is exposed through a touch contact hole which passes through the touch insulating layer T-ILD to be electrically connected to two Y-touch electrodes Y-TE adjacent in the y-axis.

The X-touch electrode line X-TEL may include a plurality of X-touch electrodes X-TE and a plurality of X-touch electrode connection lines X-CL which electrically connects between the plurality of X-touch electrodes X-TE.

The plurality of X-touch electrodes X-TE may be spaced apart from each other along an x-axis direction with a predetermined distance on the touch insulating layer T-ILD. Each of the plurality of X-touch electrodes X-TE may be electrically connected to another X-touch electrode X-TE which is adjacent in an x-axis direction by means of the X-touch electrode connection line X-CL.

The X-touch electrode connection line X-CL is disposed on the same plane as the X-touch electrode X-TE to be electrically connected to two X-touch electrodes X-TE adjacent in the x-axis direction without having a separate contact hole or formed as one body with two X-touch electrodes X-TE adjacent in the x-axis direction.

In the meantime, the Y-touch electrode line Y-TEL may be electrically connected to the touch driving circuit TDC by means of the Y-touch routing line Y-TL and the Y-touch pad Y-TP disposed in the non-active area NA. Similarly, the X-touch electrode line X-TEL may be electrically connected to the touch driving circuit TDC by means of the X-touch routing line X-TL and the X-touch pad X-TP disposed in the non-active area NA.

A step compensation layer SCL may be disposed between the touch buffer layer T-BUF and the X-touch routing line X-TL and the Y-touch routing line Y-TL. The step compensation layer SCL may be formed to overlap the first and second blocking structures. The high step which is generated by the increase in the overall height of the blocking structure DAM caused by the increased height of the spacer SPC may be relieved by disposing the step compensation layer SCL. The step compensation layer SCL may be disposed on the same plane as the touch planarization layer T-PLN which is disposed in the boundary area A2-2 in the active area AA described above in FIG. 12 in which the light emitting diode ED is not formed and may be formed of the same material as the touch planarization layer T-PLN. That is, when the touch planarization layer T-PLN is formed in the boundary area A2-2, the step compensation layer SCL may be simultaneously formed to overlap the blocking structure DAM in the non-active area NA. In this case, the step compensation layer SCL may be formed without having the mask adding process and increasing the cost.

Figure 17:
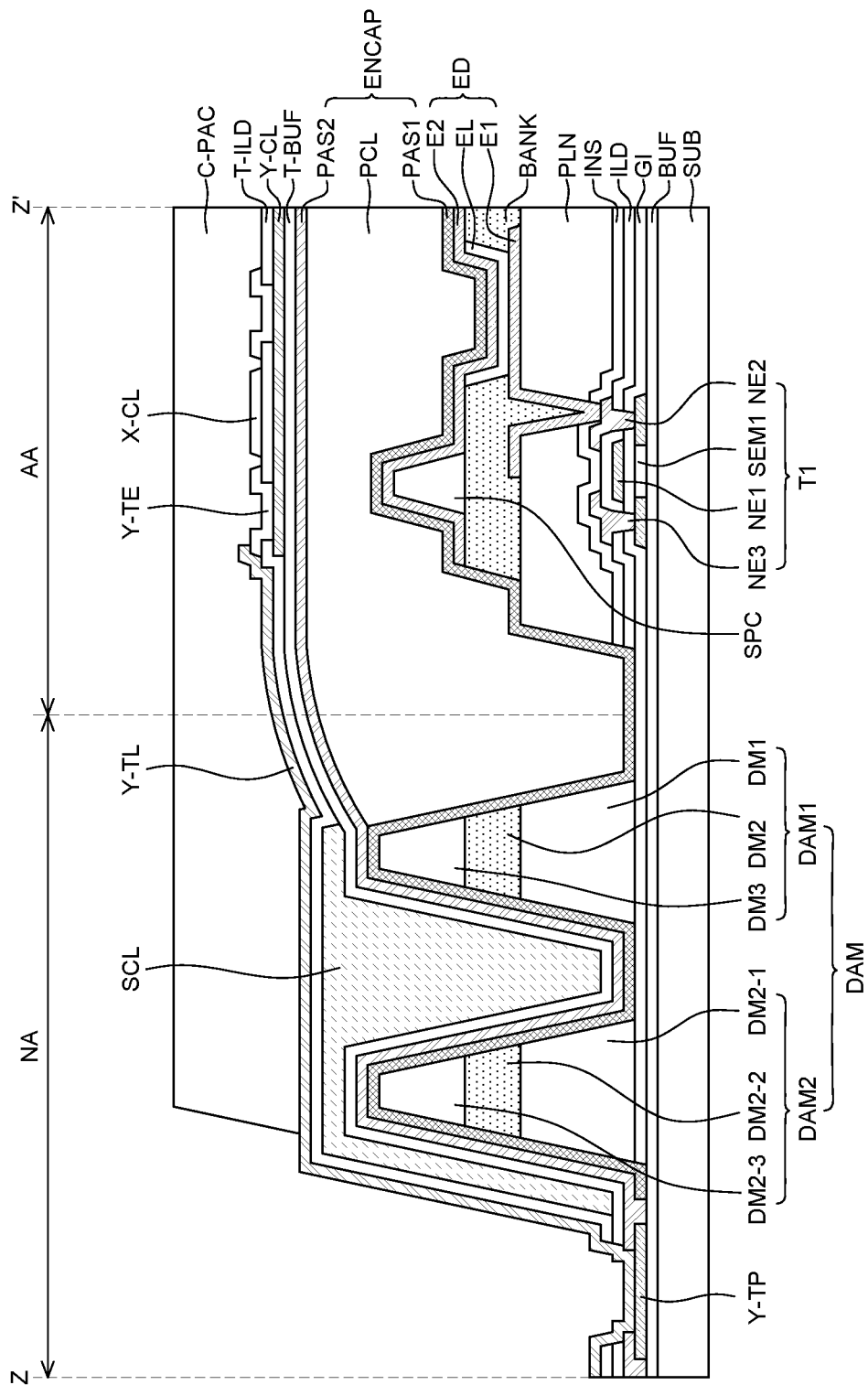
FIG. 17 is a view illustrating an example of a cross-sectional structure taken along the line Z-Z' of FIG. 15 as another exemplary embodiment of the present disclosure.

An area where the step compensation layer SCL is disposed may vary depending on the shape of the first and second blocking structures. For example, when the height of the second blocking structure is formed to be smaller than the height of the first blocking structure so that the step is steeply generated, the step compensation layer may overlap a part of the first and second blocking structures. Further, as illustrated in FIG. 17, when the heights of the first and second blocking structures are the same, the step compensation layer may be formed to cover the entire first and second blocking structures.

Here, a cover organic layer C-PAC may be formed to cover the X and Y touch electrodes X-TE and Y-TE and the touch routing line TL to suppress the corrosion of the touch electrode and the touch routing line TL due to the external moisture, or the like. For example, the cover organic layer C-PAC may be formed of an organic insulating material or formed in the form of a circular polarizing plate or an epoxy or acrylic film. For example, the cover organic layer C-PAC may be formed of the same material as the touch planarization layer T-PLN and the step compensation layer SCL.

As described above, according to the present disclosure, the step preventive layer SCL formed of the same material as the touch planarization layer T-PLN is formed in a high step area in which the touch routing line and the blocking structure overlap to relieve the step caused by the blocking structure DAM. Therefore, the disconnection of the touch routing line TL which passes through the blocking structure DAM may be suppressed.

As described above, the light emitting display device with an integrated touch screen according to an example of the present disclosure forms a step compensation layer SCL formed of the same material as the touch planarization layer T-PLN in a high step area in which the touch routing line TL and the blocking structure DAM overlap. Therefore, the step caused by the blocking structure DAM is relieved to suppress the disconnection of the touch routing line TL which passes through the blocking structure DAM. Accordingly, a display device with an integrated touch screen which implements a stable touch performance may be provided.

A light emitting display device with an integrated touch screen according to various exemplary embodiments of the present disclosure will be described as follows.

A light emitting display device with an integrated touch screen according to an exemplary embodiment of the present disclosure includes a substrate SUB including a display area (or an active area) AA in which a plurality of pixels is disposed and a non-display area (or a non-active area) NA around the display area AA. The light emitting display device may include an opening area A2-1 which is located inside the display area AA and passes through the substrate SUB and a boundary area A2-2 disposed to be in contact with the outside of the opening area A2-1. In the display area AA, there is a pixel area A1 excluding the opening area A2-1 and the boundary area A2-2. The light emitting display device may include an encapsulation unit ENCAP which covers the pixel area A1, the non-display area NA, and the boundary area A2-2. The light emitting display device may include a plurality of first touch electrodes X-TE which is disposed on the encapsulation unit ENCAP of the pixel area A1 and extends in a first direction and a plurality of second touch electrodes Y-TE which extends in a second direction. The light emitting display device may include first and second blocking structures DAM1 and DAM2 which are disposed in the non-display area NA and are configured to enclose the display area AA. A first touch routing line X-TL which is disposed on the first and second blocking structures DAM1 and DAM2 and is connected to the first touch electrode X-TE may be included. A second touch routing line Y-TL which is disposed on the first and second blocking structures DAM1 and DAM2 and is connected to the second touch electrode Y-TE may be included. The light emitting display device may include an organic cover layer C-PAC which covers the first touch routing line X-TL and the second routing line Y-TL and a touch buffer layer T-BUF which covers the encapsulation unit ENCAP. The light emitting display device may include a step compensation layer SCL located between the touch buffer layer T-BUF and the first touch routing line X-TL and the second routing line Y-TL and the step compensation layer SCL may be disposed to overlap the first and second blocking structures DAM1 and DAM2.

For example, the encapsulation unit ENCAP may be configured by at least three layers to suppress or at least reduce the permeation of the moisture or oxygen into the pixel area. For example, the encapsulation unit may be formed by two inorganic encapsulation layers PAS1 and PAS2 and one organic encapsulation layer PCL.

The organic encapsulation layer PCL planarizes a surface of the inorganic encapsulation layer PAS1 below the organic encapsulation layer PCL and the height thereof may be decreased toward the blocking structure DAM from the display area AA.

For example, in the display area AA, a light emitting diode ED, a thin film transistor which is connected to the light emitting diode, a planarization layer PLN disposed on the thin film transistor, a bank BANK which exposes an anode electrode E1 of the light emitting diode, and a spacer SPC above the bank may be further included. Each of the first and second blocking structures DAM1 and DAM2 may be formed of the same material as at least one of the planarization layer PLN, the bank BANK, and the spacer SPC.

For example, the step compensation layer SCL may be in contact with the touch buffer layer T-BUF and may overlap a part of the first and second blocking structures DAM1 and DAM2. The step compensation layer SCL may be formed of the same material as the organic encapsulation layer PCL included in the encapsulation unit ENCAP.

For example, the light emitting display device may further include a touch planarization layer T-PLN which covers the touch buffer layer T-BUF of the boundary area A2-2 and the touch buffer layer T-BUF may be disposed on the same plane as the step compensation layer SCL and may be formed of the same material as the step compensation layer.

Further, a light emitting display device with an integrated touch screen according to an exemplary embodiment of the present disclosure includes a substrate SUB including a display area AA in which a plurality of pixels are disposed and a non-display area NA around the display area AA. A light emitting diode ED may be disposed in the display area AA. An encapsulation unit ENCAP which covers the display area AA and the non-display area NA is disposed and a touch electrode line TEL may be located on the encapsulation unit ENCAP. A touch routing line TL connected to the touch electrode line TEL may be formed in the non-display area NA. An organic cover layer C-PAC which is formed above the touch electrode line TEL and the touch routing line TL and covers the touch electrode line TEL and the touch routing line TL may be included. A plurality of blocking structures DAM which are disposed in the non-display area NA and are configured to enclose the display area AA and a step compensation layer SCL between the encapsulation unit ENCAP and the touch routing line TL may be included. The step compensation layer SCL reduces the step due to the plurality of blocking structures DAM to reduce the irregularities of the surface of the encapsulation unit ENCAP.

For example, an opening area A2-1 which is located inside the display area AA and passes through the substrate SUB and a boundary area A2-2 disposed to be in contact with the outside of the opening area A2-1 may be further included. In the boundary area A2-2, a touch planarization layer T-PLN which covers the encapsulation unit ENCAP may be disposed. Here, the touch planarization layer T-PLN and the step compensation layer SCL may be disposed on the same plane and formed of the same material.

For example, a light emitting diode ED, a thin film transistor which is connected to the light emitting diode, a planarization layer PLN disposed on the thin film transistor, a bank BANK which exposes an anode electrode E1 of the light emitting diode, and a spacer SPC above the bank BANK may be further included. Each of the plurality of blocking structures DAM may be formed of the same material as at least one of the planarization layer PLN, the bank BANK, and the spacer SPC.

A touch buffer layer T-BUF between the step compensation layer SCL and the encapsulation unit ENCAP may be further included.

For example, the plurality of blocking structures DAM may include first and second blocking structures DAM1 and DAM2 and the step compensation layer SCL is in contact with the touch buffer layer T-BUF and may overlap a part of the first and second blocking structures DAM1 and DAM2.

For example, the plurality of blocking structures DAM may include first and second blocking structures DAM1 and DAM2 and the step compensation layer SCL is in contact with the touch buffer layer T-BUF and may be disposed to cover all the first and second blocking structures DAM1 and DAM2.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A light emitting display device with an integrated touch screen, comprising:
    a substrate which includes a display area in which a plurality of display pixels are disposed and a non-display area around the display area;
    an opening area which is located inside the display area and passes through the substrate and a function layer there above;
    a boundary area which is disposed to be in contact with an outside of the opening area;
    a pixel area in the display area excluding the opening area and the boundary area;
    an encapsulation unit which covers the pixel area, the non-display area, and the boundary area;
    a plurality of first touch electrodes which are disposed on the encapsulation unit of the pixel area and extends in a first direction, and a plurality of second touch electrodes which extend in a second direction;
    a first block structure and a second blocking structure which are disposed in the non-display area and are configured to enclose the display area;
    a first touch routing line which is disposed on the first blocking structure and the second blocking structure, the first touch routing line connected with the first touch electrode;
    a second touch routing line which is disposed on the first blocking structure and the second blocking structure, the second touch routing line connected with the second touch electrode;
    a touch buffer layer which covers the encapsulation unit; and
    a step compensation layer which is located between the touch buffer layer and the first touch routing line and the second touch routing line,
    wherein the step compensation layer overlaps the first blocking structure and the second blocking structure.

2. The light emitting display device according to claim 1, wherein the encapsulation unit suppresses permeation of moisture or oxygen into the pixel area and comprises at least three layers.

3. The light emitting display device according to claim 2, wherein the encapsulation unit comprises two inorganic encapsulation layers and one organic encapsulation layer.

4. The light emitting display device according to claim 3, wherein the organic encapsulation layer planarizes a surface of the inorganic encapsulation layer below the organic encapsulation layer and a height of the organic encapsulation layer is decreased toward the first blocking structure and the second blocking structure from the display area.

5. The light emitting display device according to claim 1, further comprising:
 a light emitting diode in the display area;
 a thin film transistor connected to the light emitting diode;
 a planarization layer disposed on the thin film transistor;
 a bank which exposes an anode electrode of the light emitting diode; and
 a spacer above the bank,
 wherein each of the first blocking structure and the second blocking structure is formed of a same material as at least one of the planarization layer, the bank, or the spacer.

6. The light emitting display device according to claim 5, wherein the step compensation layer is in contact with the touch buffer layer and partially overlaps the first blocking structure and the second blocking structure.

7. The light emitting display device according to claim 6, wherein the step compensation layer is formed of an organic insulating material.

8. The light emitting display device according to claim 4, wherein the step compensation layer is formed of a same material as the organic encapsulation layer included in the encapsulation unit.

9. The light emitting display device according to claim 8, further comprising:
 a touch planarization layer which covers the encapsulation unit in the boundary area.

10. The light emitting display device according to claim 9, wherein the touch planarization layer is disposed on a same plane as the step compensation layer and formed of a same material as the step compensation layer.

11. The light emitting display device according to claim 1, further comprising an organic cover layer which covers the first touch routing line and the second touch routing line.

12. A light emitting display device with an integrated touch screen, comprising:
 a substrate which includes a display area in which a plurality of display pixels are disposed and a non-display area around the display area;
 a light emitting diode in the display area;
 an encapsulation unit which covers the display area and the non-display area;
 a touch electrode line on the encapsulation unit;
 a touch routing line which is disposed in the non-display area, the touch routing line connected to the touch electrode line;
 a plurality of blocking structures which are disposed in the non-display area, the plurality of blocking structures configured to enclose the display area; and
 a step compensation layer disposed between the encapsulation unit and the touch routing line;
 wherein the step compensation layer reduces a step caused by the plurality of blocking structures to reduce irregularities of a surface of the encapsulation unit.

13. The light emitting display device according to claim 12, further comprising:
 an opening area which is located inside the display area, the opening area passing through the substrate.

14. The light emitting display device according to claim 13, further comprising:
 a boundary area which is disposed to be in contact with an outside of the opening area.

15. The light emitting display device according to claim 14, further comprising:
 a touch planarization layer which is in the boundary area, the touch planarization layer covering the encapsulation unit.

16. The light emitting display device according to claim 15, wherein the step compensation layer and the touch planarization layer are disposed on a same plane and formed of a same material.

17. The light emitting display device according to claim 16, further comprising:
 a thin film transistor connected to the light emitting diode;
 a planarization layer disposed on the thin film transistor;
 a bank which exposes an anode electrode of the light emitting diode; and
 a spacer above the bank,
 wherein each of the plurality of blocking structures is formed of a same material as at least one of the planarization layer, the bank, or the spacer.

18. The light emitting display device according to claim 17, further comprising:
 a touch buffer layer between the step compensation layer and the encapsulation unit.

19. The light emitting display device according to claim 18, wherein the plurality of blocking structures include a first blocking structure and a second blocking structure and the step compensation layer is in contact with the touch buffer layer and partially overlaps the first blocking structure and the second blocking structure.

20. The light emitting display device according to claim 18, wherein the plurality of blocking structures include a first blocking structure and a second blocking structure and the step compensation layer is in contact with the touch buffer layer and covers the first blocking structure and the second blocking structure.

21. The light emitting display device according to claim 12, further comprising an organic cover layer which covers the touch electrode line and the touch routing line.

* * * * *